United States Patent
Kajigaya

(10) Patent No.: US 7,307,906 B2
(45) Date of Patent: Dec. 11, 2007

(54) SEMICONDUCTOR STORAGE DEVICE

(75) Inventor: Kazuhiko Kajigaya, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 90 days.

(21) Appl. No.: 11/376,169

(22) Filed: Mar. 16, 2006

(65) Prior Publication Data

US 2006/0209612 A1 Sep. 21, 2006

(30) Foreign Application Priority Data

Mar. 16, 2005 (JP) ............................ 2005-075088

(51) Int. Cl.
*G11C 7/02* (2006.01)
(52) U.S. Cl. ..................................... 365/207; 365/208
(58) Field of Classification Search ................ 365/207, 365/208, 222, 63
See application file for complete search history.

(56) References Cited

U.S. PATENT DOCUMENTS 5,774,408 A * 6/1998 Shirley .................. 365/230.03
6,466,502 B1 * 10/2002 Matsumoto .................. 365/208
7,068,528 B2 * 6/2006 Won ............................ 365/63

FOREIGN PATENT DOCUMENTS

JP 2004-103657 A 4/2004

* cited by examiner

*Primary Examiner*—Anh Phung
(74) *Attorney, Agent, or Firm*—McDermott Will & Emery LLP

(57) ABSTRACT

A semiconductor storage device for storing data to unit blocks of a memory cell array, comprising: two rows of sense amplifiers arranged on both sides of bit lines and each including sense amplifiers; a switch means for switching a connecting state between one row of sense amplifiers and one side of bit lines and switching a connecting state between the other row of sense amplifiers and the other side of bit lines; a control means which sets at least one row of sense amplifiers as a cache memory, and when performing refresh operation of the unit block where row of sense amplifiers to be used as cache memory holds data, controls switch means so that the row of sense amplifiers used as cache memory is disconnected from bit lines and only the row of sense amplifiers not used as said cache memory is used in refresh operation.

11 Claims, 24 Drawing Sheets

FIG.5

| control state | selection control line to be selected | state of transistor switch ||||
|---|---|---|---|---|---|
| | | TS0 | TS1 | TS2 | TS3 |
| A | — | OFF | OFF | OFF | OFF |
| B | SL0 | ON | OFF | OFF | OFF |
| C | SL1 | OFF | ON | OFF | OFF |
| D | SL2 | OFF | OFF | ON | OFF |
| E | SL3 | OFF | OFF | OFF | ON |
| F | SL0, SL1 | ON | ON | OFF | OFF |
| G | SL2, SL3 | OFF | OFF | ON | ON |
| H | SL0, SL2 | ON | OFF | ON | OFF |
| I | SL1, SL3 | OFF | ON | OFF | ON |

SEMICONDUCTOR STORAGE DEVICE

BACKGROUND OF THE INVENTION

1. Field of the Invention

The present invention relates to a semiconductor storage device for rewritably storing data to each of unit blocks into which a memory cell array is divided. Particularly, the present invention relates to a semiconductor storage device having a configuration in which a row of sense amplifiers including a plurality of sense amplifiers is used each a cache memory.

2. Description of the Related Art

As a general configuration of a semiconductor storage device such as DRAM, such a configuration in which a memory cell array is divided into a plurality of banks and each bank is further divided into a plurality of unit blocks has been well known. Data is stored and held in memory cells formed at intersections between a plurality of word lines and a plurality of bit lines in each unit block. In conventional DRAM, a row of sense amplifiers including a plurality of sense amplifiers is arranged on each of both sides of the unit block. A configuration in which switches are provided between the unit block and the row of sense amplifiers has been also proposed (see, for example, Japanese Patent Laid-Open No. 2004-103657). If the configuration in which the row of sense amplifiers is arranged on each unit block is employed, data read out from the memory cells is held in the row of sense amplifiers by selectively activating an arbitrary word line. Thus, the row of sense amplifiers of each unit block can be used as a cash memory (hereinafter referred to as sense amplifiers cash).

Generally, refresh operation needs to be performed at a predetermined time interval in order to hold data stored in DRAM. This refresh operation is so controlled that after bit lines connected to the row of sense amplifiers is pre-charged, a word line selected to be refreshed is activated, data on the bit lines read out from memory cells on a selected word line is amplified by the sense amplifiers and rewritten into the memory cells. Then, if the refresh operation of the unit block connected to a row of sense amplifiers used as a sense amplifiers cache is performed, data held in the row of sense amplifiers at that time is destroyed in the pre-charge prior to the refresh operation. Therefore, a time in which data can be held in the sense amplifiers cache is under restriction of a refresh interval. Usually, in DRAM, data in the sense amplifiers cache needs to be updated each time a refresh takes place because the refresh operation is performed by selecting the word line in succession at a short interval of some micro seconds. As a consequence, the sense amplifiers cache cannot be used effectively, and cache hit rate drops, which is a problem to be solved.

BRIEF SUMMARY OF THE INVENTION

An object of the present invention is to provide a semiconductor storage device which protects data from destruction even if refresh operation is performed when a row of sense amplifiers of the semiconductor storage device is used as a cache memory in which data held, and allows a number of rows of sense amplifiers to be used each as cache memory effectively without any restriction of time by the refresh operation thereby improving cache hit rate.

An aspect of the present invention is a semiconductor storage device for rewritably storing data to each of unit blocks into which a memory cell array including a plurality of memory cells formed at intersections between a plurality of word lines and a plurality of bit lines is divided, comprising: two rows of sense amplifiers arranged on one side and an other side of said plurality of bit lines in each said unit block and each including a plurality of sense amplifiers for amplifying data of said plurality of memory cells through said plurality of bit lines; a switch means for switching a connecting state between one of said two rows of sense amplifiers and one side of said plurality of bit lines and switching a connecting state between an other of said two rows of sense amplifiers and an other side of said plurality of bit lines; a control means which sets at least one of said two rows of sense amplifiers as a cache memory, and when performing refresh operation of said unit block in a state in which said row of sense amplifiers to be used as said cache memory holds data, controls said switch means so that said row of sense amplifiers to be used as said cache memory is disconnected from said plurality of bit lines and only said row of sense amplifiers not to be used as said cache memory is used in refresh operation.

According to the aspect of the present invention, the memory cell array is divided into unit blocks and the semiconductor storage device is constituted by providing the rows of sense amplifiers on both sides of the unit block and then, the rows of sense amplifiers are controlled to be used each as the cache memory. In this case, when the row of sense amplifiers on one side of the unit block is used as a cache memory to hold data, this row of sense amplifiers is disconnected from the unit block by switch control and a series of the refresh operations are performed using the row of sense amplifiers on an opposite side. Thus, data in the cache memory is held without being destroyed at the time of the refresh operation and the refresh operation can be performed securely. Accordingly, the row of sense amplifiers can be used as a cache memory for a long time without being restricted by the refresh interval, so that the high accessibility of the semiconductor storage device can be obtained by improving the cache hit rate.

In the present invention, said memory cell array may be configured using a shared sense amplifier system in which adjacent said unit blocks share each said row of sense amplifiers arranged therebetween.

In the present invention, when performing refresh operation of said unit block in a state in which both said two rows of sense amplifiers holds data each as said cache memory, said control means may selectively set one of said rows of sense amplifiers to hold data and an other of said rows of sense amplifiers to abandon data, and may control said switch means so that said one of rows of sense amplifiers is disconnected from said plurality of bit lines and only said other of rows of sense amplifiers is used in refresh operation.

In the present invention, when performing refresh operation of said unit block in a state in which both said two rows of sense amplifiers holds data each as said cache memory, said control means may selectively set one of said rows of sense amplifiers to hold data and an other of said rows of sense amplifiers to save data, and may control said switch means so that said one of rows of sense amplifiers is disconnected from said plurality of bit lines and data of said other of rows of sense amplifiers is saved to an adjacent said row of sense amplifiers through said plurality of bit lines on a unit block adjacent to said unit block, only said other of rows of sense amplifiers is used in refresh operation, and saved data in said adjacent row of sense amplifiers is written back to said other of rows of sense amplifiers through said plurality of bit lines.

In the present invention, said control means may hold state information for determining a using state of each said row of sense amplifiers as said cache memory and may selectively set said one of rows of sense amplifiers and said other of rows of sense amplifiers based on said sate information.

According to the aspects of the present invention, when rows of sense amplifiers on both sides of the unit block are used each as a cache memory, as well as when the row of sense amplifiers on only one side of the unit block is used, an effective control can be performed. In this case, upon the refresh operation, with data in one row of sense amplifiers held, the other row of sense amplifiers can be controlled to abandon data or save the data to an adjacent unit block. Therefore, the cache memory can be set freely corresponding to the using state of the memory cell array and particularly, an effective cache memory can be provided for the configuration of a shared sense amplifier system.

In the present invention, in said refresh operation, after pre-charge operation for said plurality of bit lines using said row of sense amplifiers not to be used as said cache memory, two-cycle refresh operation in which said plurality of bit lines is divided into half for each cycle using said row of sense amplifiers may be performed.

In the present invention, each said sense amplifier included in said row of sense amplifiers may have two input terminals for connecting a bit line pair composed of two bit lines, and said memory cell may be formed at one of two intersections of said bit line pair on an arbitrary word line.

In the present invention, said memory cell array may have a ¼ pitch cell array configuration, and of four adjacent bit lines, said switch means may switch a connection state of even number bit lines and a connection state of odd number bit lines respectively to said two input terminals of each said sense amplifier.

In the present invention, said memory cell array may have a ½ pitch cell array configuration, and of four adjacent bit lines, said switch means may switch a connection state of a bit line pair composed of adjacent two bit lines on one side and a connection state of a bit line pair composed of adjacent two bit lines on an other side respectively to said two input terminals of each said sense amplifier.

In the present invention, said switch means may include a first switch arranged between one of two bit line pair composed of said four bit line and each said sense amplifier, and a second switch arranged between an other bit line pair composed of said four bit line and each said sense amplifier.

In the present invention, each of said first and second switches may be a transistor switch controlled on/off by a selection control line connected to a gate thereof.

The above-described aspects of the present invention can provide a useful cache memory to a variety of the memory cell arrays in terms of the arrangement of a plurality of bit lines, pattern of the memory cells, configuration of the sense amplifier or the like.

As described above, according to the present invention, the row of sense amplifiers and switch means are provided around the unit block of the semiconductor storage device such that the row of sense amplifiers can be used as a cache memory and data can be protected from destruction and held securely even if the refresh operation is performed with data held in the row of sense amplifiers as a cache memory. Consequently, a plurality of rows of sense amplifiers can be used as cache memories effectively without any restriction in time by the refresh operation, so as to improve the cache hit rate thereby obtaining excellent accessibility of the semiconductor storage device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 5 is a view showing nine control states of ON/OFF control of a switch controller based on selection control lines;

DETAILED DESCRIPTION OF THE INVENTION

The preferred embodiment of the present invention will be described with reference to the accompanying drawings. Hereinafter, an example in which the present invention is applied to DRAM as a semiconductor storage device will be described. First, the configuration of major portions in the DRAM of this embodiment will be described with reference to FIGS. 1 to 4.

Figure 1:
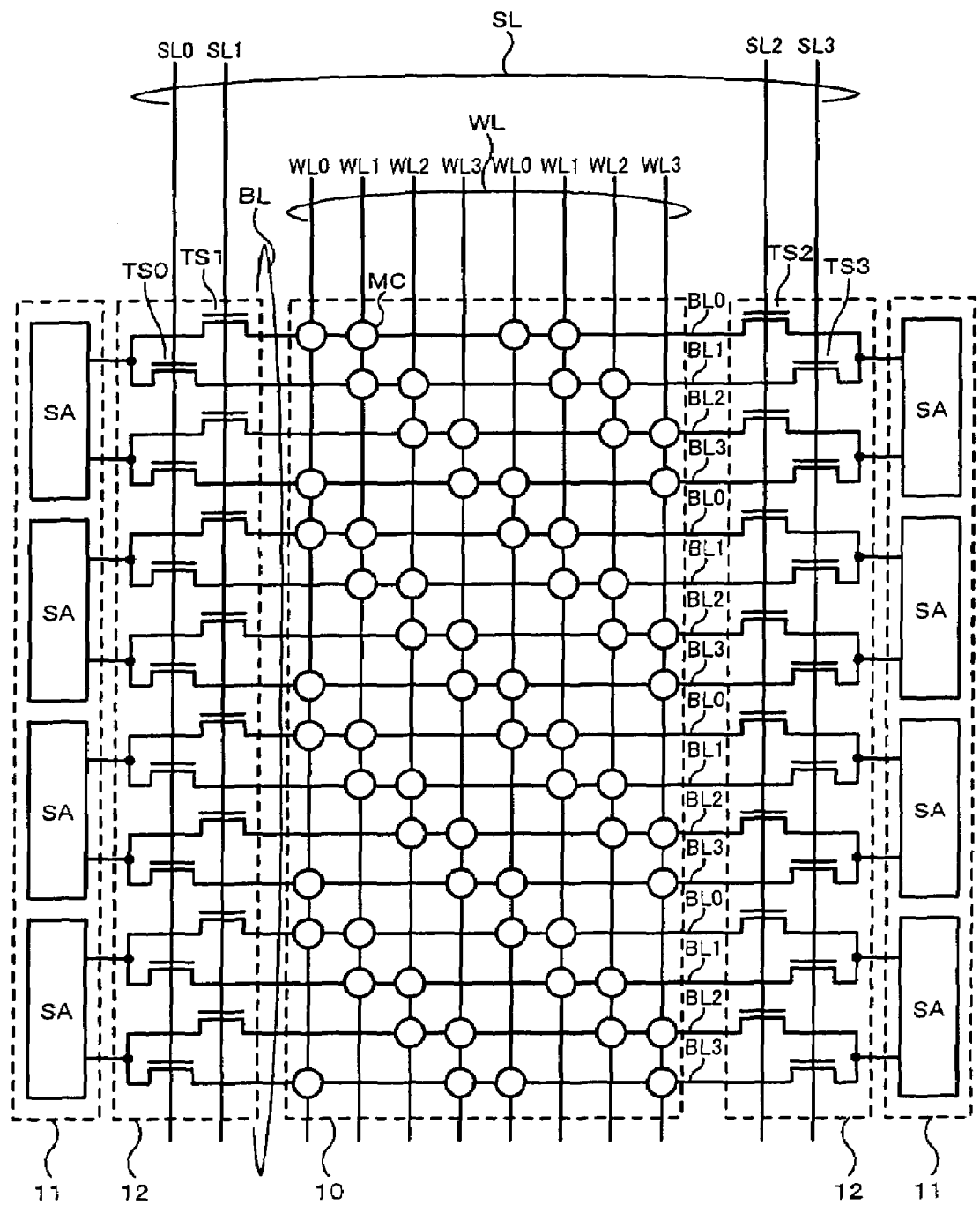
FIG. 1 is a view showing a configuration of a mat employing a ¼ pitch cell array configuration in which adjacent mats do not share sense amplifiers in DRAM of this embodiment.
Figure 2:
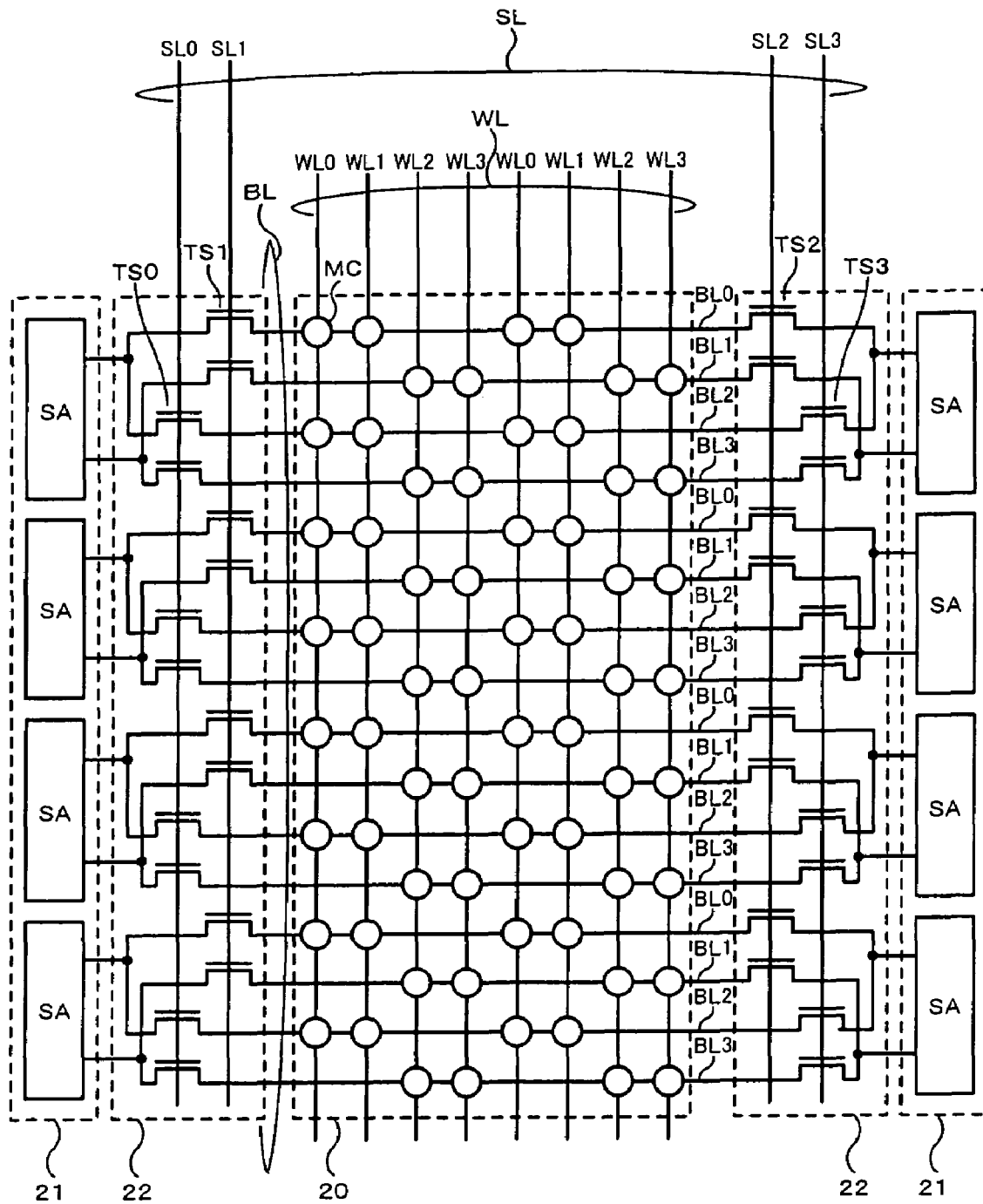
FIG. 2 is a view showing a configuration of a mat employing a ½ pitch cell array configuration in which adjacent mats do not share sense amplifiers in DRAM of this embodiment.
Figure 3:
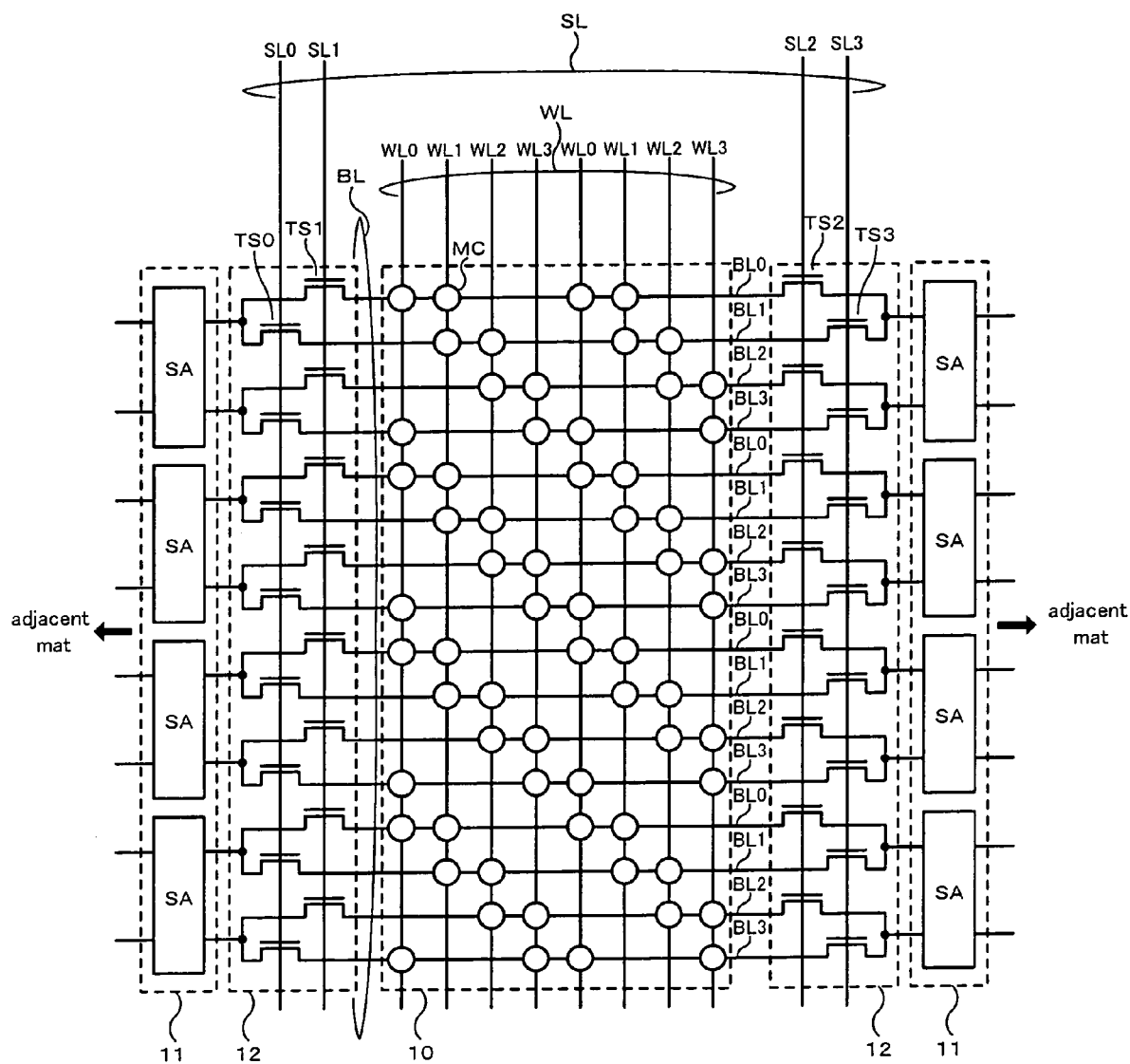
FIG. 3 is a view showing a configuration of a mat employing a shared sense amplifier system and a ¼ pitch cell array configuration in DRAM of this embodiment.
Figure 4:
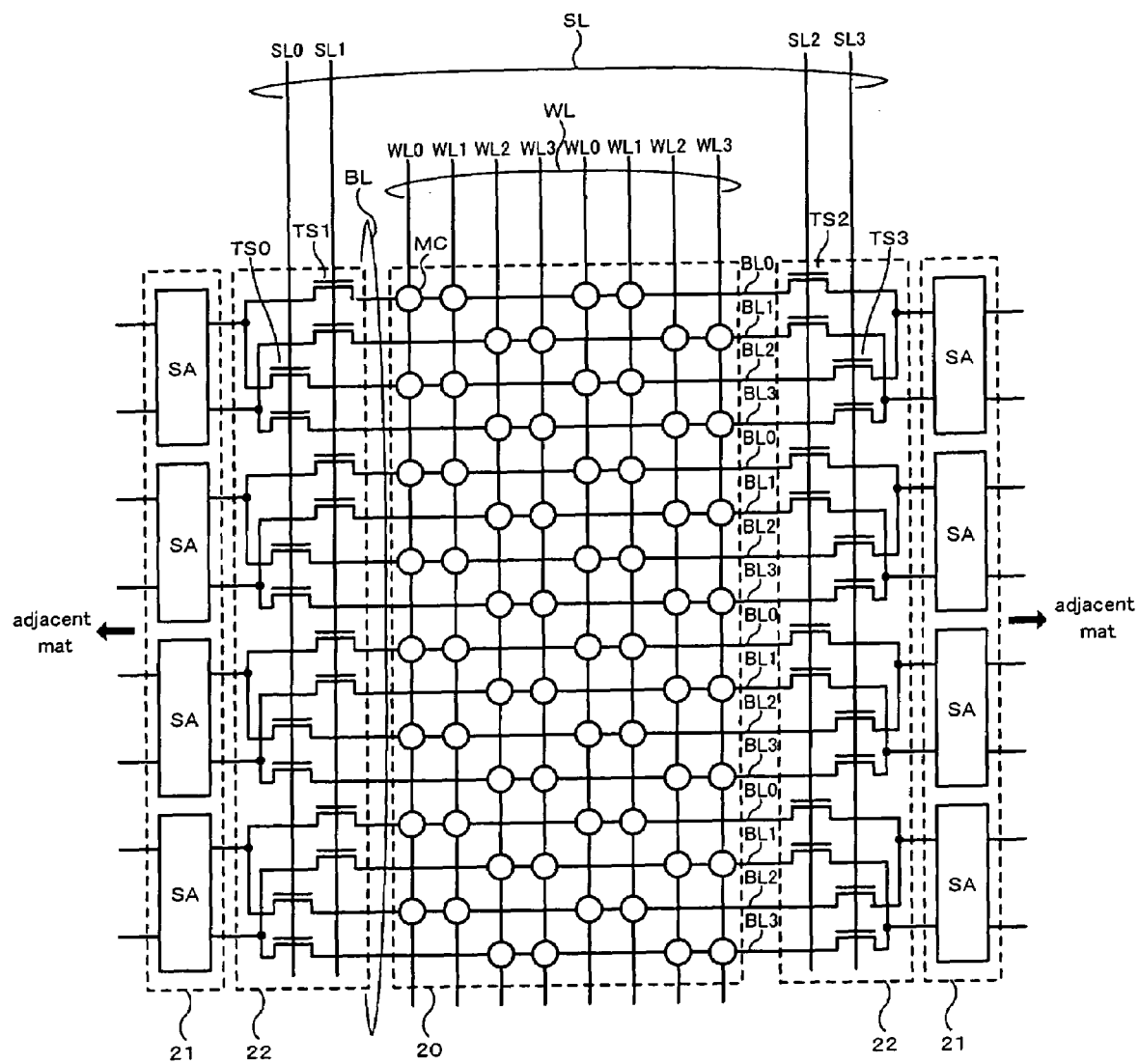
FIG. 4 is a view showing a configuration of a mat employing a shared sense amplifier system and a ½ pitch cell array configuration in DRAM of this embodiment.

FIGS. 1 to 4 show four different configurations of a mat 10 as a unit block which is obtained by dividing a memory cell array of the DRAM of this embodiment and its peripheral portion. FIGS. 1 and 2 show a configuration in which adjacent mats 10 do not share the sense amplifiers, and FIGS. 3 and 4 show a configuration employing a shared sense amplifier system in which the adjacent mats 10 share the sense amplifier. FIGS. 1 and 3 show a configuration called ¼ pitch cell array configuration and FIGS. 2 and 4 show a configuration called ½ pitch cell array configuration. These ¼ pitch cell array configuration and the ½ pitch cell array configuration will be described in detail.

First, the configuration of FIG. 1 will be described. Meanwhile, since the mat 10 and its peripheral portion are basically common to the configurations of FIGS. 1 and 3, following description will be applied to the configuration of FIG. 3. The mats 10 are formed within a range including a plurality of the word lines WL and a plurality of bit lines BL intersecting therewith. Although FIGS. 1 to 4 show an example in which a single mat 10 includes eight word lines WL and sixteen bit lines BL, generally, a mat 10 of a desired size can be formed by arranging m word lines WL and n bit lines BL.

Memory cells MC are formed at intersections corresponding to half of all intersections between the word lines WL and the bit lines BL within the mat 10. That is, if m×n intersections are formed by m word lines WL and n bit lines BL, m×n/2 memory cells are formed so that the entire mat 10 can store data of m×n/2 bits. Each memory cell MC includes a MOS transistor and a capacitor and stores data of 1 bit depending on accumulated charge. Intersections at each of which a memory cell is formed and intersections at each of which no memory cell is formed are arranged regularly according to a predetermined pattern in the mat 10.

The memory cells MC on the word line WL and the bit line BL are disposed in the same pattern at every fourth line of the both lines. As shown in FIG. 1, word lines WL0, WL1, WL2 and WL3 corresponding to four kinds of patterns and bit lines BL0, BL1, BL2 and BL3 corresponding to four kinds of patterns are expressed separately. For example, in the bit line BL0 located at the uppermost of the four bit lines BL in FIG. 1, a pattern in which two intersections with memory cells MC and two intersections without memory cells are repeated. In the bit line BL1 located at the second position, the pattern of the bit line BL0 is shifted by one to the right and in respective bit lines BL2 and BL3 located at the third and fourth positions, the pattern is shifted by one each to the right successively. The word lines WL has the same configuration so that the pattern is shifted by one in the order of the word lines WL0 to WL3.

The configuration of FIG. 1 is called a ¼ pitch cell array configuration because the four word lines WL are arranged in a repetitive unit (1 pitch) while adjacent bit lines BL are shifted by only ¼ of the aforementioned pitch.

On the other hand, two rows of sense amplifiers 11 each including a predetermined number of the sense amplifiers SA, four selection control lines SL and switch controllers 12 each including a plurality of transistor switches controlled ON/OFF by the selection control lines SL are provided around the mat 10. In one side of the mat 10 (left side in FIG. 1), a row of sense amplifiers 11, the selection control lines SL0 and SL1 and a predetermined number of the transistor switches TS0 and TS1 are included. And in the other side (right side in FIG. 1) of the mat 10, a row of sense amplifiers 11, the selection control lines SL2 and SL3 and a predetermined number of the transistor switches TS2, TS3 are included. Both sides of the mat 10 are configured symmetrically to each other.

Each switch controller 12 is connected between the sense amplifiers SA in the row of sense amplifiers 11 and the bit lines BL. In this case, the transistor switch TS0 or TS1 is connected to the left side row of sense amplifiers 11 of FIG. 1 and the transistor switch TS2 or TS3 is connected to the right side row of sense amplifiers 11 of FIG. 1. Of the four bit lines as a set, the bit lines BL0 and BL2 of odd numbers from the top of FIG. 1 are connected between the transistor switches TS1 and TS2, and the bit lines BL1 and BL3 of even numbers from the top of FIG. 1 are connected between the transistor switches TS0 and TS3.

Each sense amplifiers SA in the row of sense amplifiers 11 has two input terminals. Each input terminal is connected to any of the transistor switches TS0 to TS3 of the switch controller 12. That is, the two input terminals of each sense amplifiers SA in the left side row of sense amplifiers 11 are connected to both transistor switches TS0 and TS1, and the two input terminals of each sense amplifiers SA of the sense amplifier 11 on the right side are connected to both transistor switches TS2 and TS3. Thus, all the sense amplifiers SA included in the rows of sense amplifiers 11 on the both sides of the mat 10 can be connected to the four bit lines BL as a set selectively through the switch controller 12.

The ON/OFF control of the switch controller 12 based on the selection control lines SL will be described with reference to FIGS. 5 and 6. Since the selection control lines SL0 to SL3 are connected successively to each gate of the transistor switches TS0 to TS3, the transistor switches TS0 to TS3 can be controlled ON/OFF freely by applying desired control signals to the selection control lines SL0 to SL3. FIG. 5 shows nine control states (states A to I) corresponding to a combination of selection of the four selection control lines SL0 to SL3.

The selection control line SL to be selected corresponding to the states A to I is controlled to be high and the other selection control lines SL are controlled to be low. The state A is a control state which turns OFF all the four transistor switches TS0 to TS3, the states B to E are control states which turn ON only one of the transistor switches TS0 to TS3 and the states F to I are control states which turn ON only two of the transistor switches TS0 to TS3. Changes of connecting states corresponding to the above-described control states are shown in FIGS. 6A to 6D by exemplifying one of sense amplifiers SA in the left side row of sense amplifiers 11.

Figure 6A:
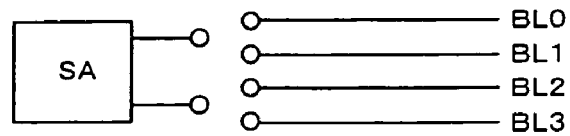
FIGS. 6A to 6D are views showing changes of connecting sates of ON/OFF control of switch controller based on selection control lines.

FIG. 6A shows a connecting state of the state A in FIG. 5 in which both selection control lines SL0 and SL1 are controlled to be not selected (same for the states D, E and G). In this state, both transistor switches TS0 and TS1 are turned OFF so that the two input terminals of the sense amplifier SA are disconnected from the four bit lines BL0 to BL3. When data holding state is maintained to use the left side row of sense amplifiers 11 as a sense amplifiers cache as described above, the connecting state of 6A is set up.

Figure 6B:
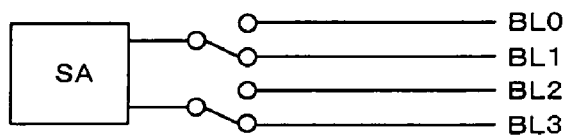
Figure 6C:
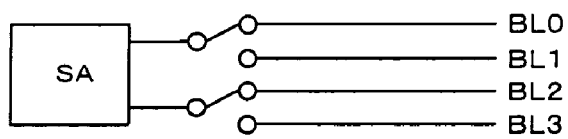

FIGS. 6B and 6C show connecting states in which one of the selection control lines SL0 and SL1 is controlled to be selected while the other is controlled not to be selected. The connecting state of FIG. 6B corresponds to the state B (state H also) of FIG. 5, in which only the transistor switch TS0 is turned ON by the selection control line SL0 so that the even number bit lines BL1 and BL3 are connected to two input terminals of the sense amplifier SA. Further, the connecting state of FIG. 6C corresponds to the state C (state I also) of FIG. 5, in which only the transistor switch TS1 is turned ON by the selection control line SL1 so that the odd number bit lines BL0 and BL2 are connected to two input terminals of the sense amplifier SA.

In other words, either of a bit line pair composed of the odd number bit lines BL0 and BL2 or a bit line pair composed of the even number bit lines BL1 and BL3 is connected to the two input terminals of the sense amplifier SA. In this case, two bit lines BL arranged on every other line constitute the bit line pair, while an odd number bit line and an even number bit line BL do not constitute the bit line pair. As understood from FIG. 1, if the bit line pair is constituted in this combination, memory cells MC are connected to only one input terminal of the sense amplifier SA when an arbitrary word line WL is selected.

Figure 6D:
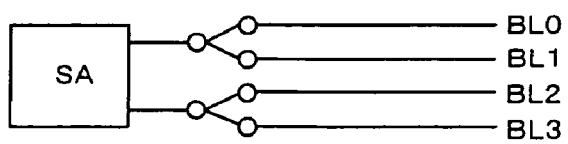

FIG. 6D shows a connecting state of the state F of FIG. 5 in which both selection control lines SL0 and SL1 are controlled to be selected. This state allows both transistor switches TS0 and TS1 to turn ON so that both bit lines BL0 and BL1 are connected to one input terminal of the sense amplifier SA while both bit lines BL2 and BL3 are connected to the other input terminal. As described later, a connecting state of 6D is set up when the four bit lines BL0 to BL3 are pre-charged at the same time in a specified control operation.

Although FIGS. 6A to 6D show the connecting states of the sense amplifier SA in the left side row of sense amplifiers 11 of FIG. 1, the same configuration is basically applied to the sense amplifier SA in the right side row of sense amplifiers 11 of FIG. 1 and thus, connecting states symmetrical to FIGS. 6A to 6D may be presumed.

Next, the configuration of FIG. 2 will be described. FIG. 2 shows a mat 20 formed within a range including a plurality of the word lines WL and a plurality of the bit lines BL like FIG. 1. Although this configuration is the same as FIG. 1 in that the memory cells MC are formed at intersections corresponding to half of all intersections between the word lines WL and the bit lines BL, the arrangement of the memory cells MC is different. That is, the configuration of FIG. 2 is called a ½ pitch cell array configuration because the four word lines WL are arranged in a repetitive unit (1 pitch) while adjacent bit lines BL are shifted by only half of the aforementioned pitch (corresponding to two memory cells MC).

Two rows of sense amplifiers 21 each including a predetermined number of the sense amplifiers SA, four selection control lines SL and switch controllers 22 each including a plurality of transistor switches controlled ON/OFF by the selection control lines SL are provided around the mat 20. Although respective components of FIG. 2 are common to FIG. 1 in this case, its connection form is different from FIG. 1, reflecting a difference of the arrangement of the memory cells MC of the mat 20.

More specifically, of four bit lines BL as a set, adjacent bit lines BL0 and BL1 are connected between the transistor switches TS1 and TS2 while adjacent bit lines BL2 and BL3 are connected between the transistor switches TS0 and TS3. Two input terminals of each sense amplifier SA in the left side row of sense amplifiers 21 are connected to the transistor switches TS0 and TS1, and two input terminals of each sense amplifier SA in the right side row of sense amplifiers 21 are connected to both transistor switches TS2 and TS3.

Comparing the configuration of FIG. 2 with the configuration of FIG. 1, a combination of the bit lines BL connected to the two input terminals of the sense amplifier SA through the switch controller 22 is different. On the other hand, the ON/OFF control of the switch controller 12 based on the selection control lines SL has nine control states like FIG. 5 so that a connecting state in which the positions of the bit lines BL (two bit lines BL1 and BL2) are exchanged in FIGS. 6A to 6D should be assumed. In this case, either of a bit line pair composed of adjacent bit lines BL0 and BL1 or a bit line pair composed of adjacent bit lines BL2 and BL3 is connected to two input terminals of the sense amplifier SA. As understood from FIG. 2, if the bit line pairs are constituted in this combination, the memory cells MC are connected to only one input terminal of the sense amplifier SA when an arbitrary word line WL is selected, like in FIG. 1.

Next, the configurations adopting the shared sense amplifier system of FIGS. 3 and 4 will be described. Basically, respective components of FIG. 3 are common to FIG. 1 and respective components of FIG. 4 are common to FIG. 2. A difference of this case exists in that each of two rows of sense amplifiers 11 is shared by adjacent two mats 10. For example, the left side row of sense amplifiers 11 of FIG. 3 has two input terminals on the left as well as two input terminals on the right and the input terminals on the left are connected to other mat 10 (not shown) through the switch controller 12. The same pattern is repeatedly arranged on both sides of the configuration shown in FIG. 3. This is the same for FIG. 4. This configuration allows the adjacent two mats 10 to use the row of sense amplifiers 11 therebetween by controlling the switch controllers 12 on both sides of the row of sense amplifiers 11 appropriately.

Figure 7:
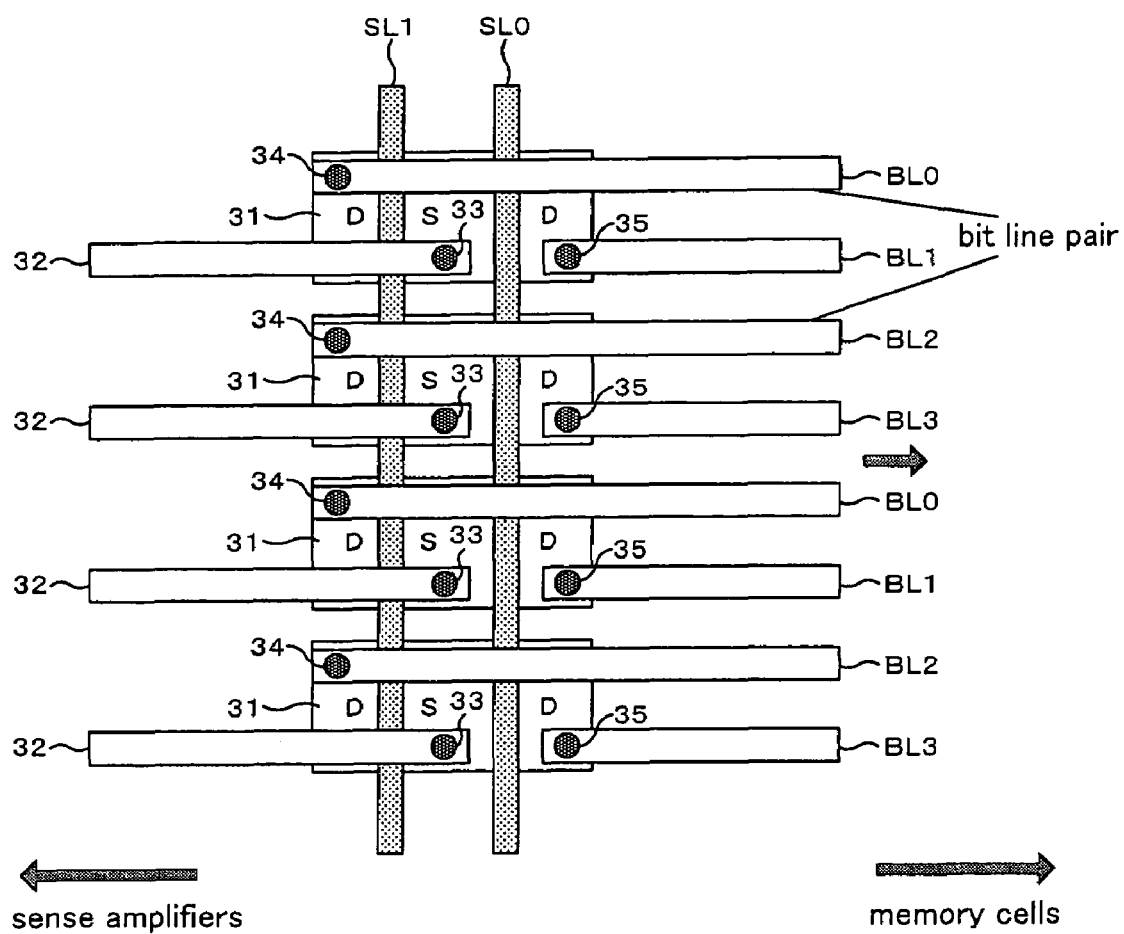
FIG. 7 is a view showing an example of a first layout of the switch controller corresponding to the ¼ pitch cell array configuration of FIG. 1 or 3.

Next, an example of a layout of the switch controller 12 in a case where this embodiment is constructed on a semiconductor chip will be described. FIG. 7 shows an example of a first layout of the switch controller 12 corresponding to the ¼ pitch cell array configuration shown in FIG. 1 or 3. The layout of FIG. 7 includes transistor switches TS0 and TS1 connected to the two sense amplifiers SA in the left side row of sense amplifiers 11 of FIG. 1 of the switch controller 12 and its peripheral portion. A pair of the transistor switches TS0 and TS1 is composed of combined MOS transistors. Four rectangular diffusion layers 31 formed corresponding to the MOS transistors are disposed in a range shown in FIG. 7, so that four pairs of the transistor switches TS0 and TS1 can be formed.

Two selection control lines SL0 and SL1 arranged in parallel to each other serve as gate electrodes in each diffusion layer 31, and a source S between the selection control lines SL0 and SL1 and two drains D on both sides thereof are formed. Wire 32 connected to one input terminal of the sense amplifier SA is connected to the source S of the diffusion layer 31 through a contact 33. Each of the odd number bit lines BL0 and BL2 is connected to one drain of the diffusion layer 31 through a contact 34. Further, each of the even number bit lines BL1 and BL3 are connected to the other drain D of the diffusion layer 31 through a contact 35. As described above, the two bit lines BL arranged on every other line form a bit line pair connected to one sense amplifier SA.

In the layout of FIG. 7, each diffusion layer 31 needs to have a size which allows an arrangement with a gap corresponding to two bit lines BL. Thus, the entire layout area can be reduced, but the width of a channel of each MOS transistor which depends upon the size of the diffusion layer 31 is limited.

Figure 8:
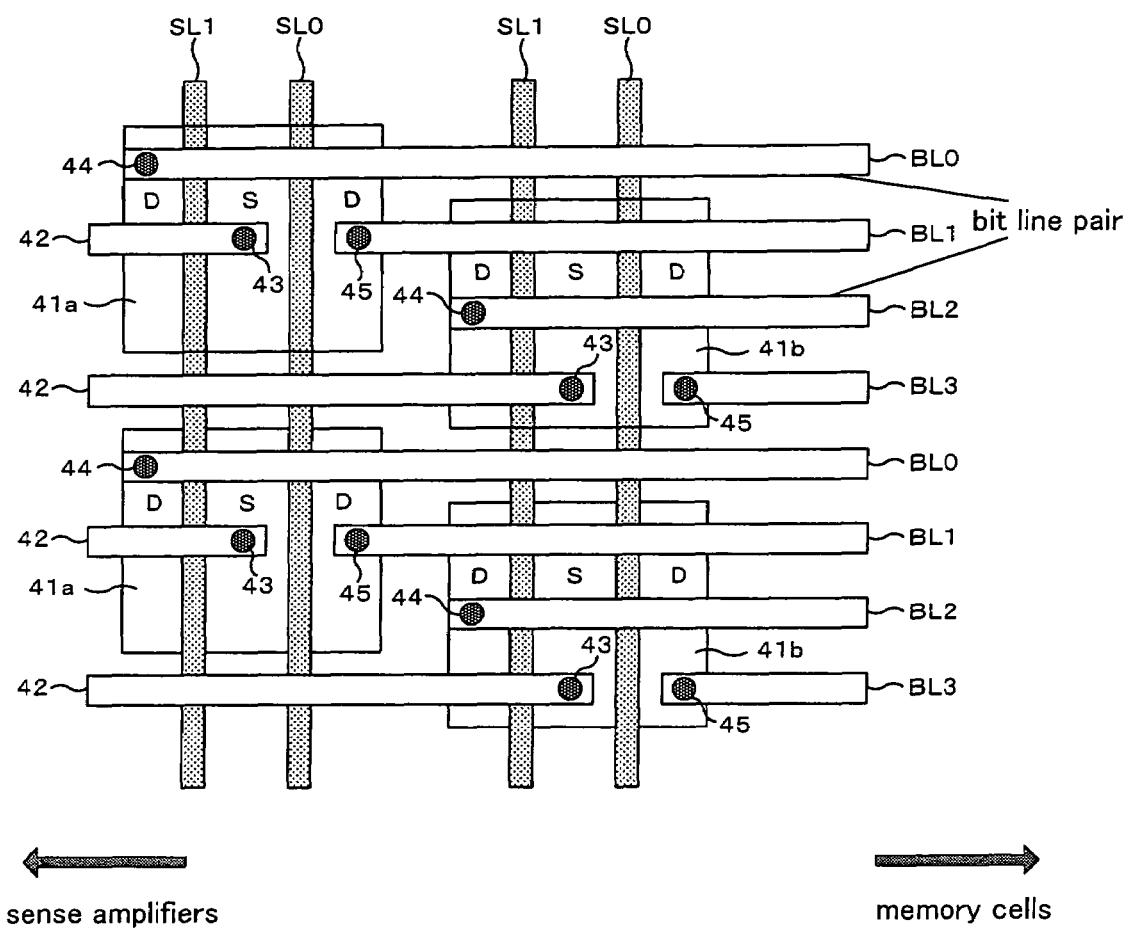
FIG. 8 is a view showing an example of a second layout of the switch controller corresponding to the ¼ pitch cell array configuration of FIG. 1 or 3.

Meanwhile, FIG. 8 shows an example of a second layout of the switch controller 12 corresponding to the ¼ pitch cell array configuration shown in FIG. 1 or 3. The layout of FIG. 8 includes four diffusion layers 41 (41a and 41b) and the MOS transistors which form four pairs of transistor switches TS0 and TS1 in the switch controller 12 as similar components to FIG. 7. However a difference exists in the shape and arrangement of the diffusion layer 41 as compared with FIG. 7. That is, the respective diffusion layers 41 are not disposed in line but two diffusion layers 41a and two diffusion layers 41b are formed at each shifted position, so that they are disposed in two lines.

Since the selection control lines SL0 and SL1 are used as a gate electrode of one diffusion layer 41a and a gate electrode of the other diffusion layer 41b, they are arranged by two each totaling four lines in parallel. A source S between the selection control lines SL0 and SL1 and two drains D on both sides thereof are formed in the respective diffusion layers 41a and 41b. Each wire 42 connected to one input terminal of the sense amplifier SA is connected to the source S of the diffusion layer 41a or 41b through a contact 43. Each of the odd number bit lines BL0 and BL2 are connected to one drain D of each of the diffusion layers 41a and 41b through a contact 44. Further, each of the even number bit lines BL1 and BL3 are connected to the other drain D of the diffusion layers 41a and 41b through a contact 45. The bit line pairs shown in FIG. 8 are formed in the same combination as FIG. 7.

However, in the layout shown in FIG. 8, diffusion layers 41a and 41b can have a size which allows an arrangement with a gap corresponding to four bit lines BL, different from the layout of FIG. 7. The size necessary in the extension direction of the bit line BL is increased because of the diffusion layers 41a and 41b disposed in two lines. Thus, the channel width of the MOS transistors can be increased sufficiently although the entire layout area is increased. Consequently, a sufficient current can be supplied to the MOS transistors of the switch controller 12, whereby providing an advantageous configuration from viewpoints of operating velocity.

Figure 9:
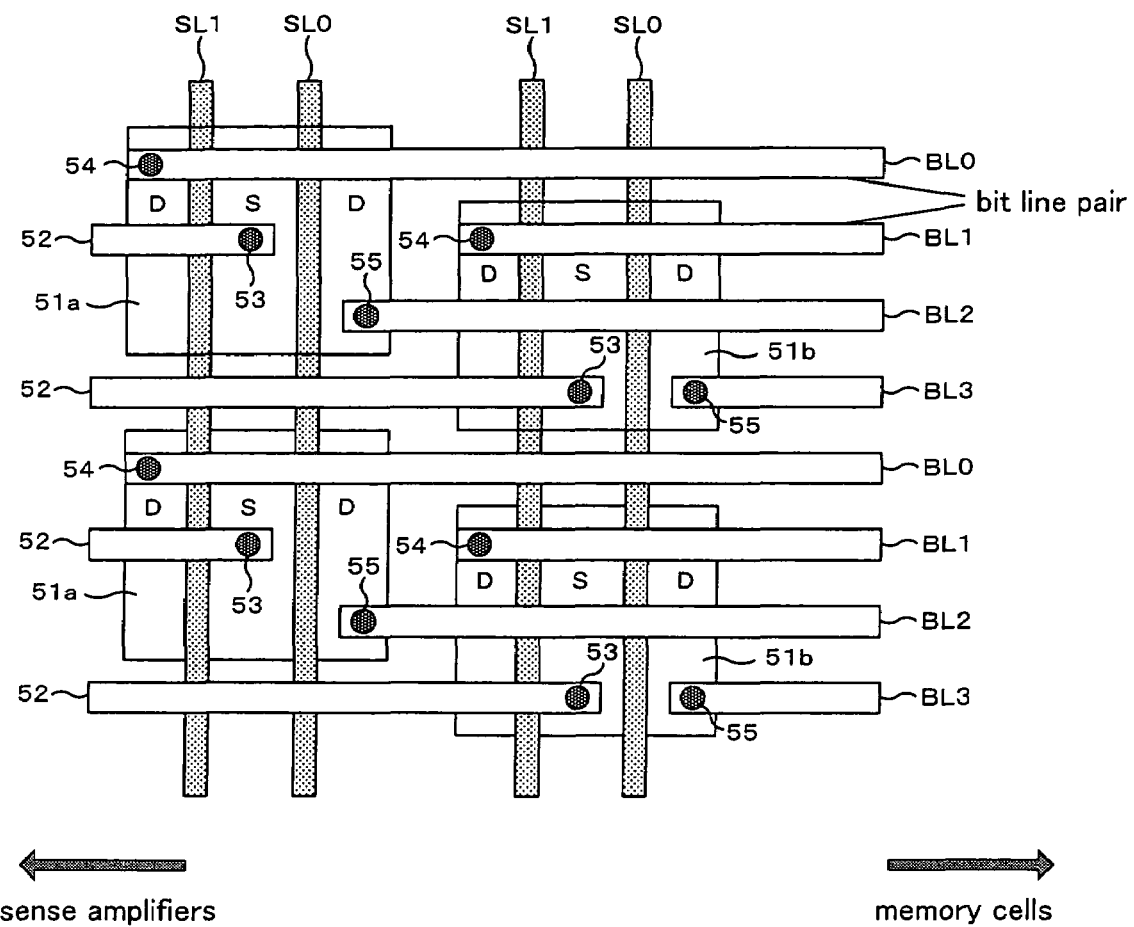
FIG. 9 is a view showing an example of a first layout of the switch controller corresponding to the ½ pitch cell array configuration of FIG. 2 or 4.

Next, FIG. 9 shows an example of a layout of the switch controller 22 corresponding to the ½ pitch cell array configuration shown in FIG. 2 or 4. The layout of FIG. 9 includes transistor switches TS0 and TS1 connected to two sense amplifiers SA in the left side row of sense amplifiers 21 of FIG. 2 in the switch controller 22 and its peripheral portion. In this case, the shape and arrangement of the diffusion layers 51a and 51b corresponding to the MOS transistors and the configuration of the selection control lines SL0 and SL1 are common to the layout of FIG. 8.

In each of the diffusion layers 51a and 51b, the selection control lines SL0 and SL1 are used as gate electrodes and the source S between the selection control lines SL0 and SL1 and two drains D on both sides thereof are formed. Each wire 52 connected to one input terminal of the sense amplifier SA is connected to the source S of the diffusion layer 51a or 51b through a contact 53. The bit lines BL are connected to two drains D on both sides of the diffusion layers 51a and 51b through contacts 54 and 55 and the two bit lines BL are arranged on every other line. The layout of FIG. 8 reflects the configuration of FIG. 2, thereby achieving a layout for forming a bit line pair with adjacent two bit lines BL.

In addition, in the layout of FIG. 9, the entire layout area is increased but it is the same as the layout of FIG. 8 in that the channel width of the MOS transistors can be increased.

Next, the operation of the DRAM of this embodiment will be described. Hereinafter, a control flow in using the sense amplifiers cache while executing refresh at a predetermined interval will be described. Following description is made on the ¼ pitch cell array configuration employing the shared sense amplifier system of FIG. 3.

As regards the sense amplifiers cache control method of this embodiment, two examples thereof will be described. The first example is a control method which uses only the row of sense amplifiers 11 on one side of the mat 10 of FIG. 3 as a sense amplifiers cache. The second example concerns a control method which uses the two rows of sense amplifiers 11 on both sides of the mat 10 of FIG. 1 as sense amplifiers caches. Hereinafter, the first example will be described with reference to FIGS. 10 to 15 and the second example will be described with reference to FIGS. 16 to 22.

Regarding the first example, connecting state diagrams (FIGS. 10, 11, 13 to 15) which change in accordance with the operation will be explained in the order of control. These connecting state diagrams show schematically a circuit portion of the shared sense amplifier system, which includes two adjacent mats 10a and 10b and the peripheral portion including three rows of sense amplifiers 11a, 11b and 11c and six switch controllers 12a, 12b, 12c, 12d, 12e and 12f. Although the memory cell array of DRAM practically has more components, the basic operation can be understood with only the range specified in the aforementioned connecting state diagrams.

Figure 10:
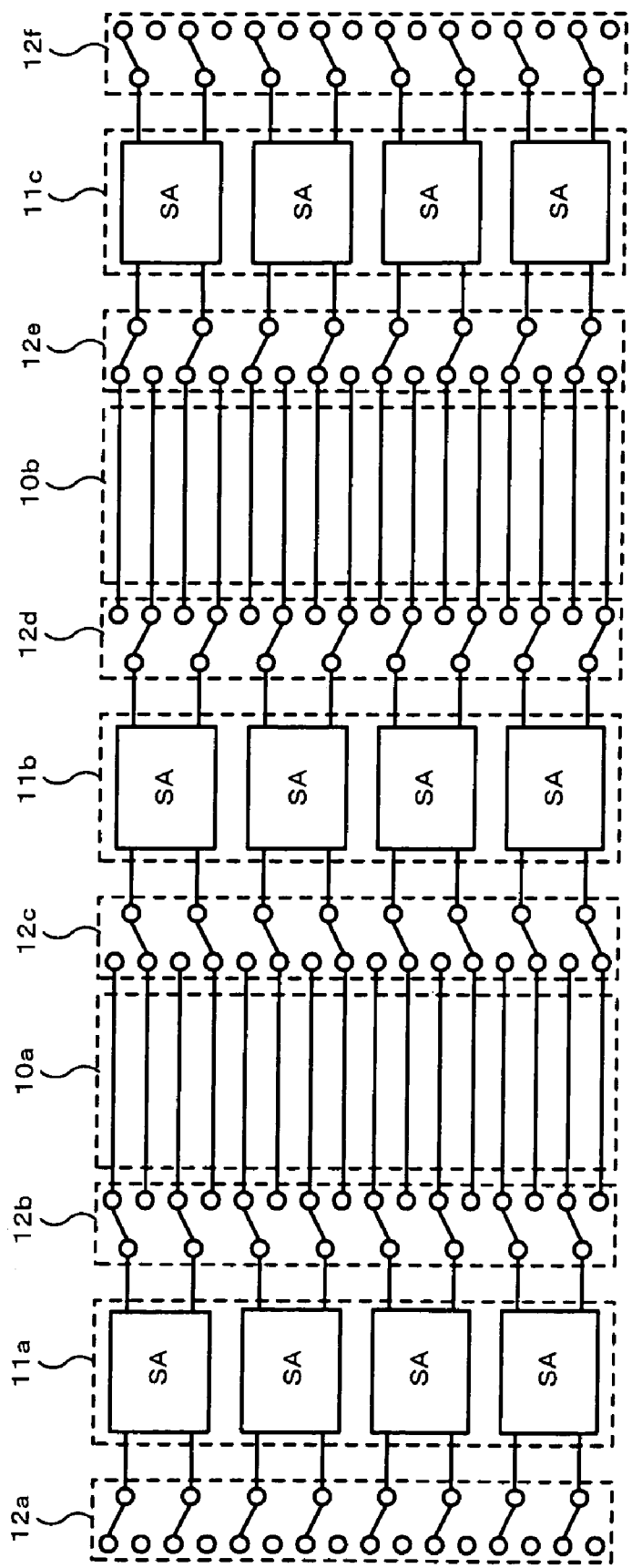
FIG. 10 is a connecting state diagram in which pre-charge operation is performed without using rows of sense amplifiers each as sense amplifiers cache in a first example.

FIG. 10 is a connecting state diagram in which pre-charge operation is performed without using the rows of sense amplifiers 11a, 11b and 11c each as the sense amplifiers cache. If attention is paid to the switch control to the mat 10a on the left side, the switch controllers 12b and 12c on both sides of the mat 10a are controlled according to the state I of FIG. 5. That is, since the odd number bit lines BL0 and BL2 are connected to the left side row of sense amplifiers 11a and the even number bit lines BL1 and BL3 are connected to the right side row of sense amplifiers 11b, all the bit lines BL of the mat 10a are respectively connected to any sense amplifier SA.

The mat 10b adjacent the mat 10a is switch-controlled in a reverse direction to the mat 10a (state H of FIG. 5), and odd number bit lines BL and even number bit lines BL are exchanged with each other in the mat 10a. In such a case in which a number of the mats 10 are arranged on the memory cell array, control can be performed so that two connecting states are repeated alternately by the switch controller 12.

With the state of FIG. 10, the pre-charge operation is performed to all the bit lines BL on the mats 10a and 10b all at once so as to supply a pre-charge voltage through the switch controller 12 by a pre-charge equalizer circuit (not shown) attached to the sense amplifier SA. This pre-charge voltage is assumed to be an intermediate voltage between power source voltage and ground voltage.

Figure 11:
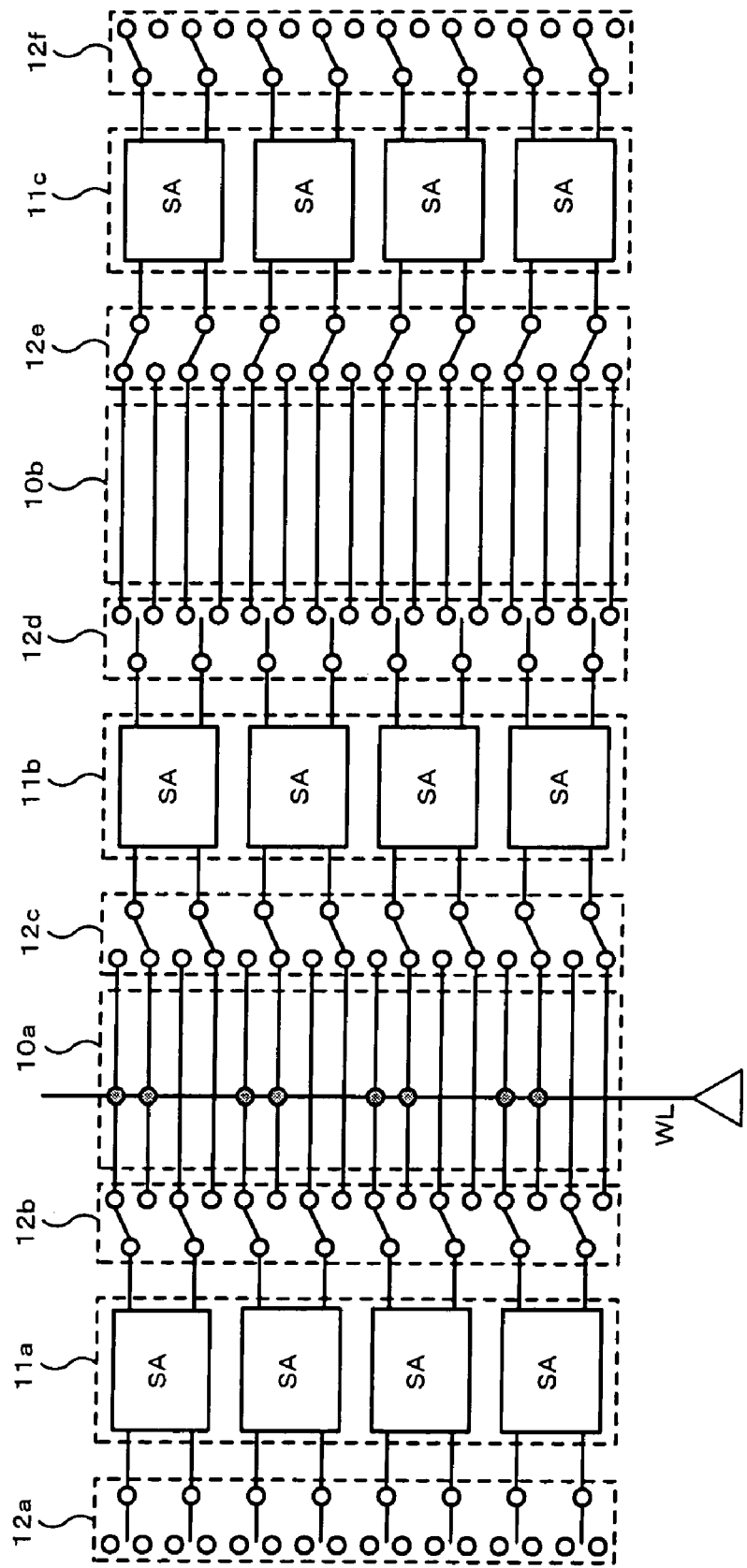
FIG. 11 is a connecting state diagram in which read-access operation of the mat is performed in the first example.

Hereinafter, attention is paid to the mat 10a and an operation when using only the right side row of sense amplifiers 11b as a sense amplifiers cache will be described. FIG. 11 is a connecting state diagram in which read-access operation of the mat 10a is performed. A predetermined word line WL of the mat 10a is selected in response to a row address specified by read access. The memory cells MC are disposed on half of intersections between selected word lines WL and intersecting bit lines BL.

As shown in FIG. 11, the switch controllers 12b and 12c between the mat 10a to be accessed and the rows of sense amplifiers 11a and 11b on both sides maintain the same connecting state as FIG. 10. On the other hand, switch controllers 12a and 12d located on an opposite side to the rows of sense amplifiers 11a and 11b are controlled to be disconnected from the bit lines BL. When a selected word line WL is activated, data on each memory cell MC on the word line WL is amplified by each sense amplifier SA in the rows of sense amplifiers 11a and 11b.

At this time, only data of the memory cell MC activated with the bit even number lines BL1 and BL3 as a bit line pair is held in the right side row of sense amplifiers 11b as a sense amplifiers cache. Data in the memory cells MC activated with the odd number bit lines BL0 and BL2 as a bit line pair is only latched by the rows of sense amplifiers 11a on the left side temporarily and is not held in the sense amplifiers cache. Therefore, the page size of the sense amplifiers cache of this embodiment is half the number of activated bits at the time of read access.

Figure 12:
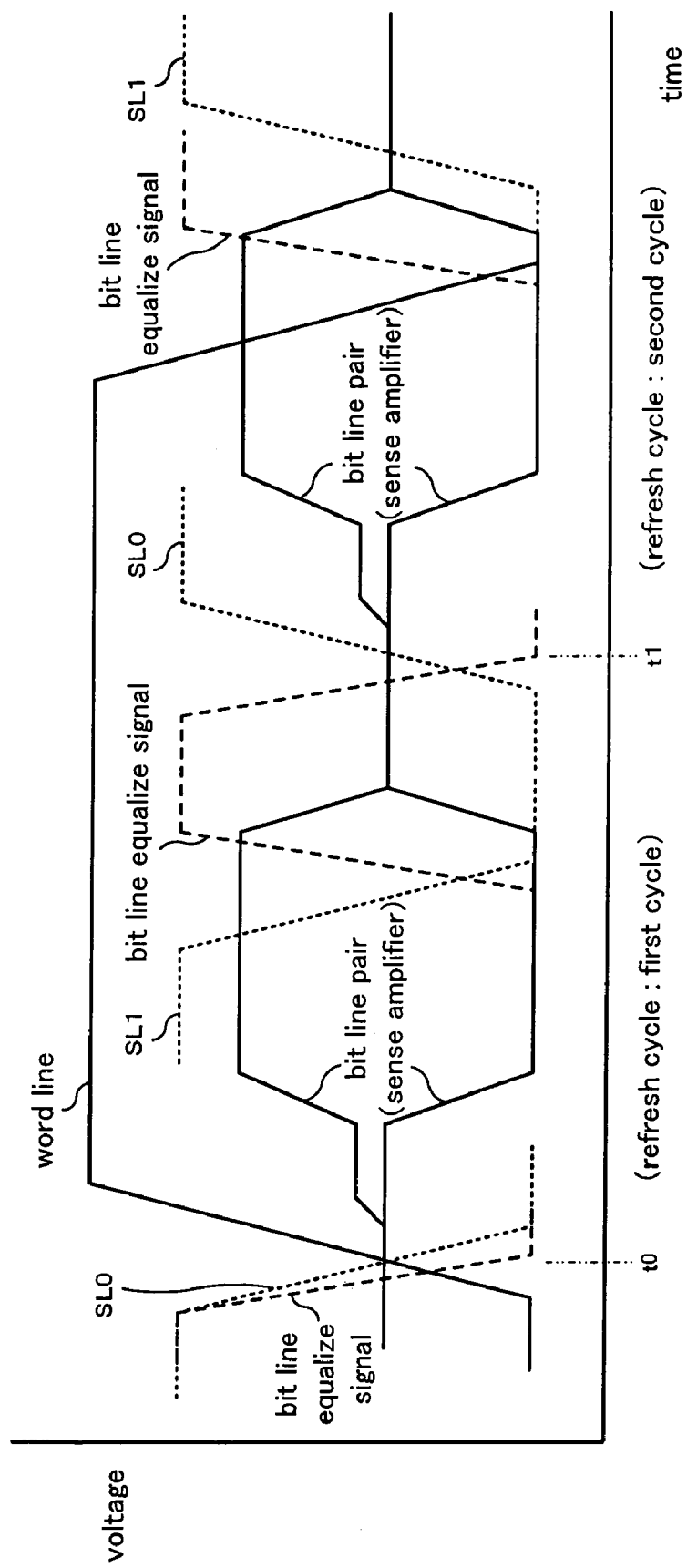
FIG. 12 is a view showing signal waveforms in the first example.

Next, the refresh operation performed when the sense amplifiers cache is holding data by the read access operation shown in FIG. 11 will be described. FIG. 12 shows signal waveforms at the time of the refresh operation. The timing in the signal waveforms of FIG. 12 and the process of the refresh operation will be explained.

Figure 13:
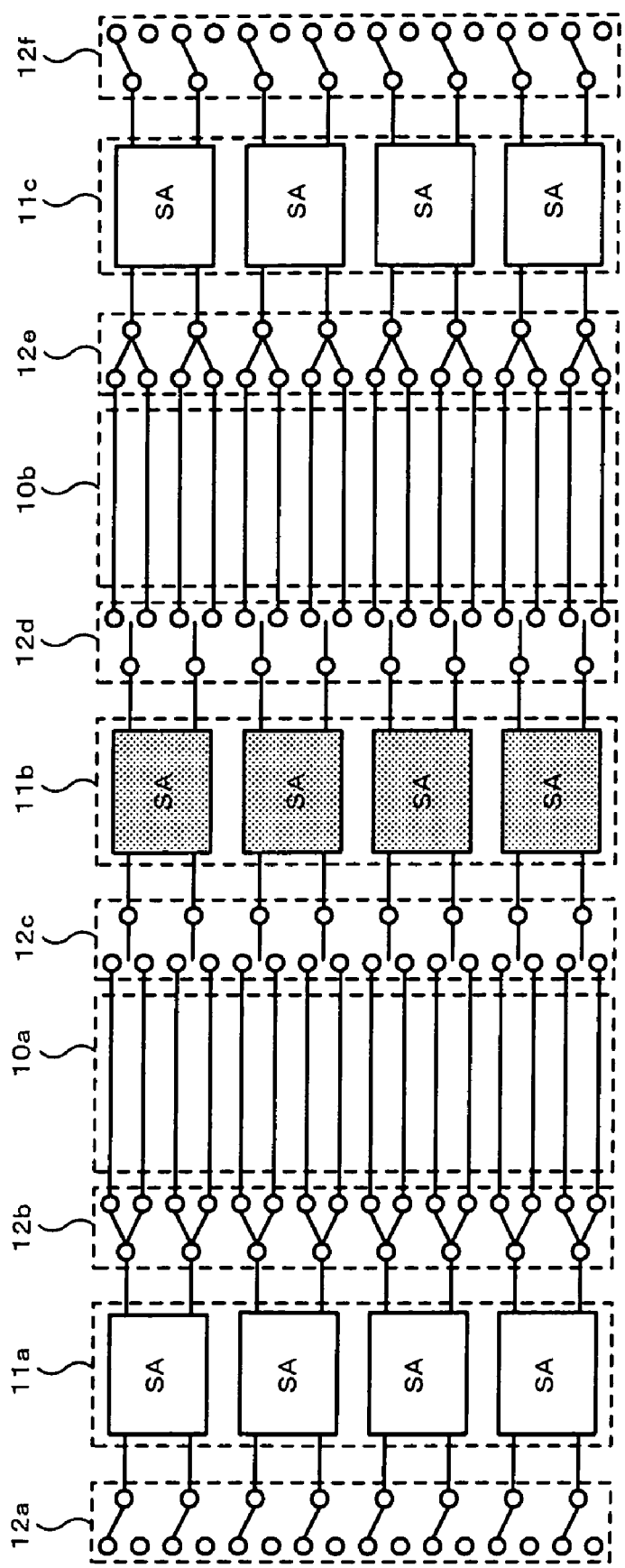
FIG. 13 is a connecting state diagram in which the pre-charge operation prior to the refresh operation is performed in the first example.

FIG. 13 is a connecting state diagram in which the pre-charge operation prior to the refresh operation is performed. Since the right side row of sense amplifiers 11b of the mat 10a holds data as a sense amplifiers cache, the switch controllers 12b and 12c are controlled according to the state F of FIG. 5. That is, all the bit lines BL of the mat 10a are connected to the left side row of sense amplifiers 11a and disconnected from the right side row of sense amplifiers 11b. In the mat 10b adjacent the mat 10a, it is assumed that the state of the switch controllers 12d and 12e on both sides are controlled symmetrically with the mat 10a side.

As indicated at the initial time of FIG. 12, when a bit line equalize signal of the pre-charge equalizing circuit attached to the aforementioned sense amplifier SA becomes high level (ON level), the pre-charge operation is performed, with the selection control lines SL0 and SL1 set to high. As a consequence, a pre-charge voltage is supplied to all the bit lines BL of the mat 10a through the switch controller 12. Thereafter, the bit line equalize signal changes to low so that the pre-charge operation completes.

Figure 14:
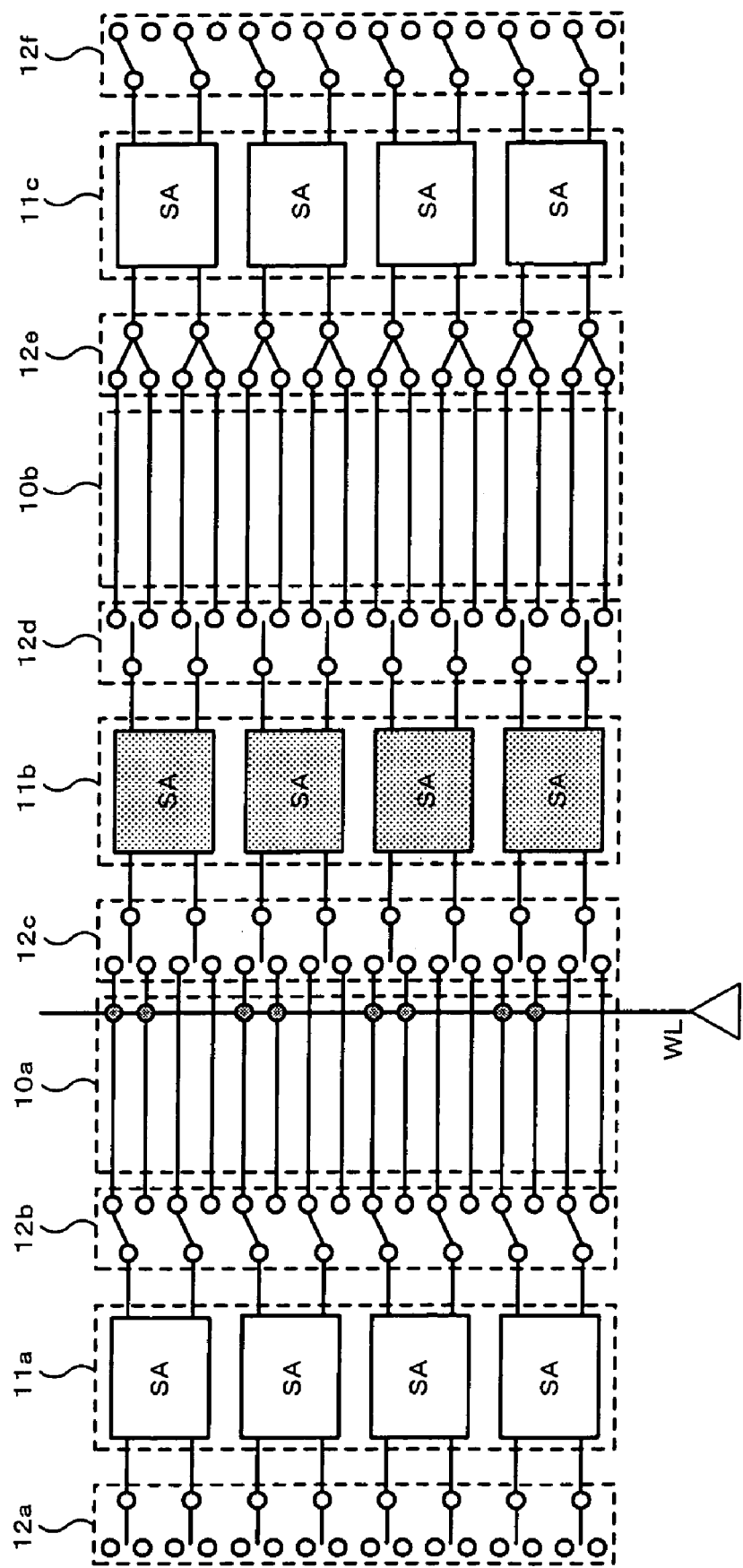
FIG. 14 is a connecting state diagram of refresh cycle of first half of the refresh operation on the word line selected to be refreshed of the mat in the first example.

Next, FIG. 14 is a connecting state diagram of refresh cycle of first half of the refresh operation on the word line WL selected to be refreshed of the mat 10a. The row of sense amplifiers 11b on the right side of the mat 10a is used as a sense amplifiers cache, which is in a state of holding data as shown in FIGS. 12 and 13. Thus, in order to avoid using it in the refresh operation, two-cycle refresh operation is performed with the entire operation divided into first and second half.

As shown in FIG. 14, the switch controllers 12b and 12c are controlled according to the state C of FIG. 5. That is, the odd number bit lines BL0 and BL2 are switched so as to be connected as a bit line pair to the sense amplifier SA of the left side row of sense amplifiers while maintaining a state in which the mat 10a is disconnected from the right row of sense amplifiers 11b like FIG. 13. At this time, the connecting state of FIG. 13 changes to the connecting state of FIG. 14 at timing t0 in which the selection control line SL0 at the initial state falls from high to low in FIG. 12.

On the other hand, a word line WL selected to be refreshed rises to high to be activated at the same timing t0. From the memory cells MC located at the odd number bit lines BL0 and BL2 of the memory cells MC on this word line WL, their data is read out by each bit line pair to the left side row of sense amplifiers 11a. At this time, the signal levels of a bit line pair is amplified from minute level at the beginning by the sense amplifier SA in FIG. 12. Data read out by each sense amplifier SA is rewritten to an original memory cell MC.

Figure 15:
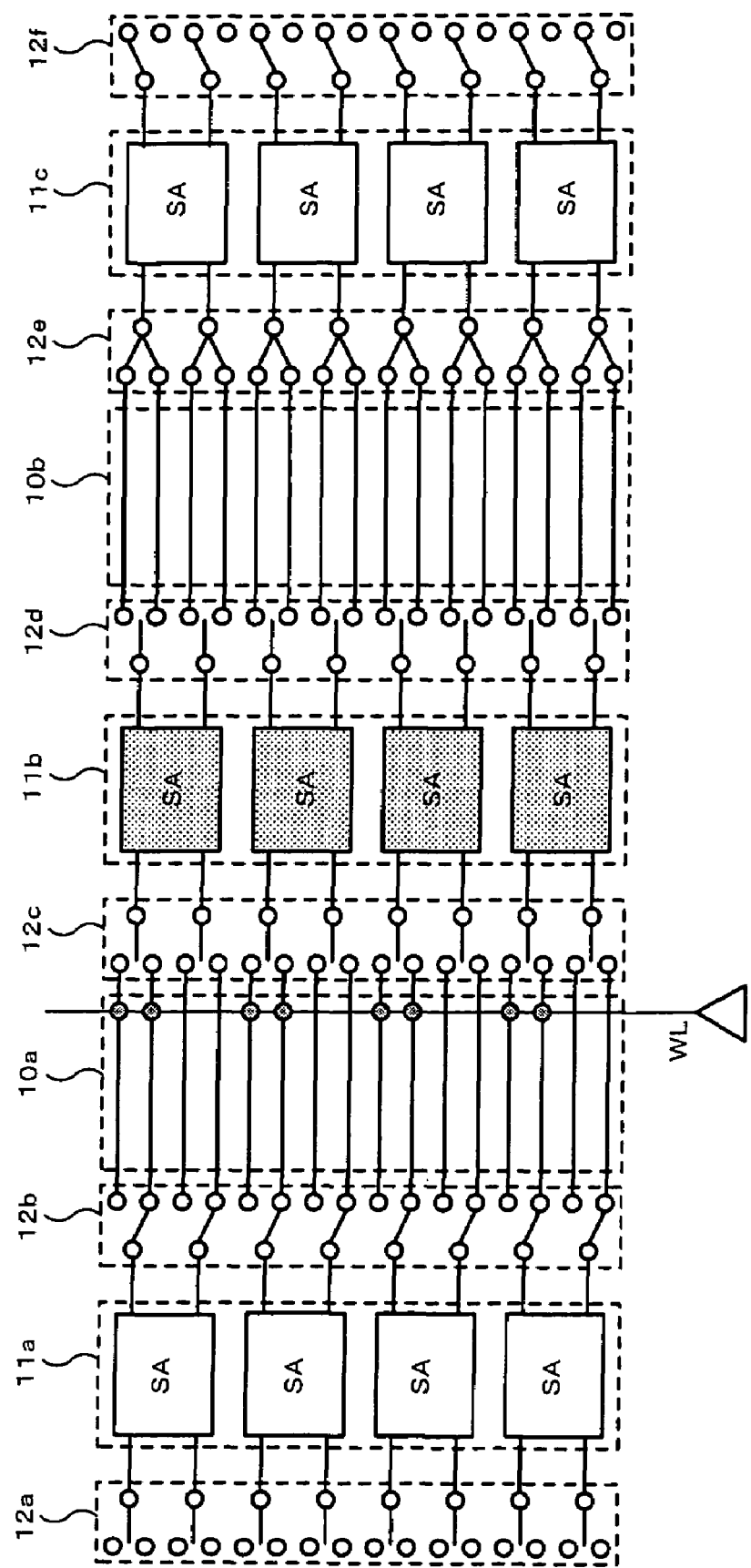
FIG. 15 is a connecting state diagram of refresh cycle of second half of the refresh operation on the word line selected to be refreshed of the mat in the first example.

Next, FIG. 15 is a connecting state diagram of refresh cycle of the second half of the refresh operation on the same word line WL. In this case, the switch controllers 12b and 12c are controlled according to the state B of FIG. 5. Thus, the state of FIG. 14 is changed to a state in which the even number bit lines BL1 and BL3 are connected as a bit line pair to each sense amplifier SA in the left side row of sense amplifiers 11a.

In this case, the selection control line S1 falls from high to low temporarily in FIG. 12 so that the bit line equalize signal changes to high for a predetermined period with the left side row of sense amplifiers 11a disconnected from the mat 10a. This is intended to protect data read out through the bit lines BL in the refresh cycle of the second half by supplying pre-charge voltage to the wire of the input side of the row of sense amplifiers 11a from being destroyed by data of the refresh cycle of the first half left in the sense amplifiers SA. Then, the selection control line SL0 rises from low to high at timing t1 so that the state changes to that of FIG. 15.

Next, of the memory cells MC on the selected word line WL, data of the memory cells MC on the even number bit lines BL1 and BL3 is read out to the left side row of sense amplifiers 11a for each bit line pair. In this case also, the signal levels of the bit line pair is changed as shown in FIG. 12 like the refresh cycle of the first half, and data is rewritten to the original memory cells MC after amplification by the sense amplifiers SA. Then, the selected word line WL falls to low to complete the refresh operation. Thereafter, the bit line equalize signal and the selection control line SL1 changes to high, so that the pre-charge voltage is supplied to the bit line pair of the sense amplifiers portion (its bit line pair) and the bit line pair of the mat 10a and thus, the state is returned to the first state of FIG. 12.

In addition, the above-described operation can be applied to a case in which the role of the left side row of sense amplifiers 11a is exchanged with that of the right side row of sense amplifiers 11b with respect to the mat 10a (case in which the left side row of sense amplifiers 11a is used as a sense amplifiers cache and the right side row of sense amplifiers 11b performs the pre-charge operation and the refresh operation).

The configuration of the first example allows the pre-charge operation and the refresh operation to be performed using only one row of sense amplifiers 11 without a necessity of using the other row of sense amplifiers 11. And data held in one row of sense amplifiers 11 used as a sense amplifiers cache continues to be held without being destroyed after the mat 10 is refreshed. Therefore, the sense amplifiers cache can be used without being limited by an interval of the refresh operation so as to hold data securely for a long time thereby improving the hit rate of the sense amplifiers cache.

Next, the second example will be described with reference to FIGS. 16 to 22. The same connecting state diagrams as FIGS. 10, 11, 13 and 14 of the first example described previously can be presumed in the refresh operation of the second example. However, in the second example, not only one of the rows of sense amplifiers 11a and 11b, but both of them can be used as a sense amplifiers cache for a target mat 10a. Thus, a configuration for controlling the sense amplifiers cache by determining its state needs to be added as well as the configuration of an ordinary DRAM.

Figure 16:
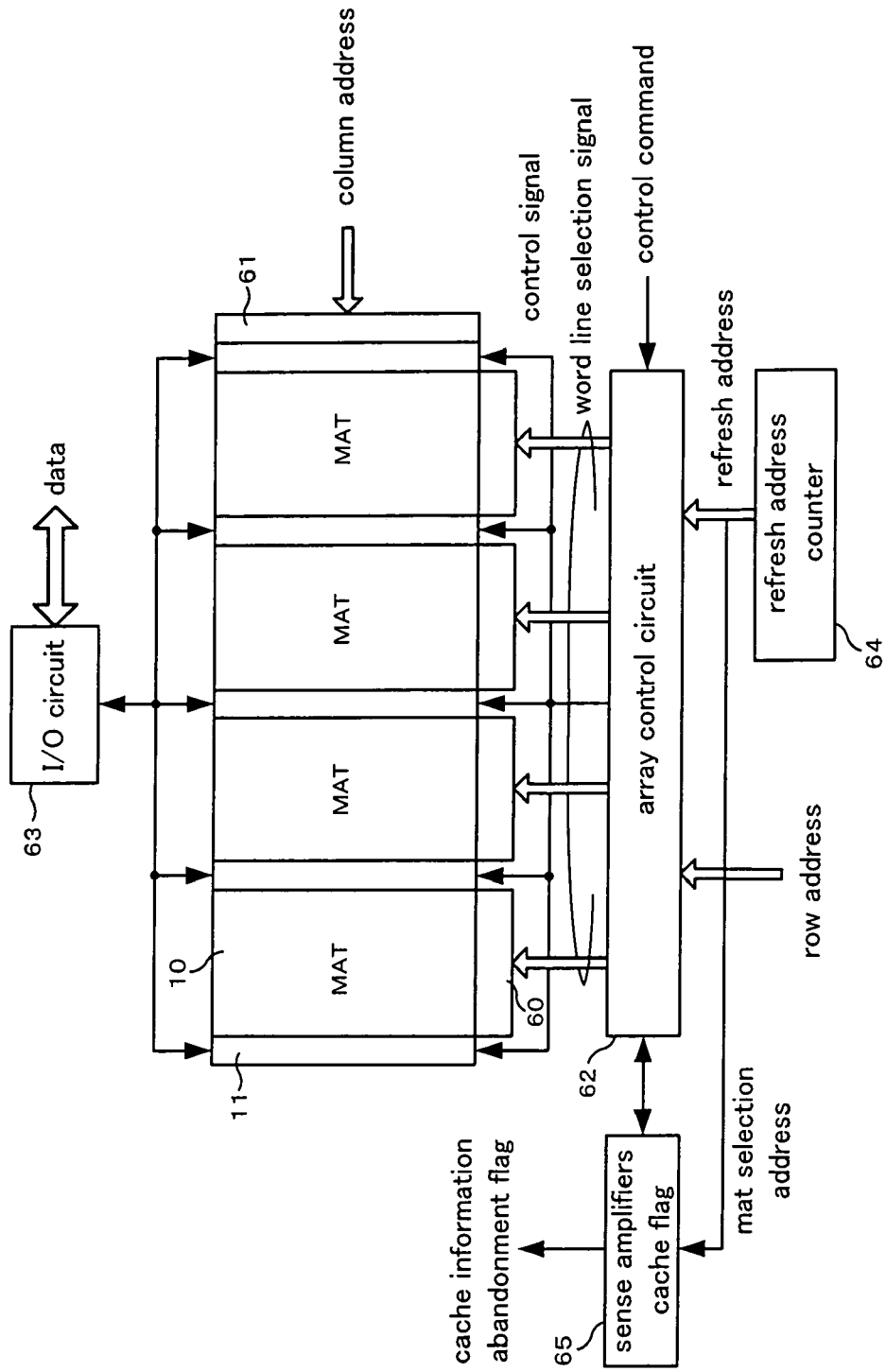
FIG. 16 is a block diagram of major portions of DRAM having a configuration to realize a control corresponding to a second example.

FIG. 16 is a block diagram of major portions of DRAM having the configuration to realize a control corresponding to the second example. In the configuration of FIG. 16, the memory cell array is divided into a plurality of the mats 10. Actually the memory cell array is divided into banks including a predetermined number of mats (not shown) and the operation is controlled for each bank.

In FIG. 16, A plurality of the rows of sense amplifiers 11 corresponding to the shared sense amplifier system are arranged between the adjacent two mats 10. The switch controller 12 (not shown) is arranged between each mat 10 and each row of sense amplifiers 11. Further, a row decoder 60 for selecting a word line WL corresponding to a specified row address and a column decoder 61 for selecting a bit line BL corresponding to a specified column address are provided in each mat 10.

An array control circuit 62, an I/O circuit 63, a refresh address counter 64 and a sense amplifiers cache flag 65 are provided in the peripheral portion of the memory cell array in the DRAM of the second example. The array control circuit 62 controls the operation of the entire memory cell array. For example, the array control circuit 62 controls normal read access operation, write access operation and refresh operation to be performed at a predetermined interval and also controls operation for using the row of sense amplifiers 11 as a sense amplifiers cache. The array control circuit 62 supplies a word line selection signal based on the row address to the column decoder 60 and supplies a control signal for controlling operation of the row of sense amplifiers 11.

The array control circuit 62 controls the operation in response to control commands from outside. When a read or write command is issued, read or write data of the predetermined mat 10 is input or output between the I/O circuit 63 and outside through the row of sense amplifiers 11 under a control of the array control circuit 62. On the other hand, when a refresh command for holding data in the memory cell array is issued, the array control circuit 62 controls the refresh operation on a selected word line WL of a corresponding mat 10 based on a refresh address generated by the refresh address counter 64.

The array control circuit 62 controls the operation relating to the sense amplifiers cache at the time of normal operation or refresh operation. Then, state information for determining whether or not each of a plurality of rows of sense amplifiers 11 is used as a sense amplifiers cache is stored in the sense amplifiers cache flag 65. The array control circuit 62 can control a plurality of rows of sense amplifiers 11 appropriately by referring to the sense amplifiers cache flag 65 at the time of the refresh operation. In a case in which holding data of the sense amplifiers cache is abandoned at the time of the refresh operation described later, cache information abandonment flag generated based on the state information stored in the sense amplifiers flag 65 is sent to outside.

Figure 17:
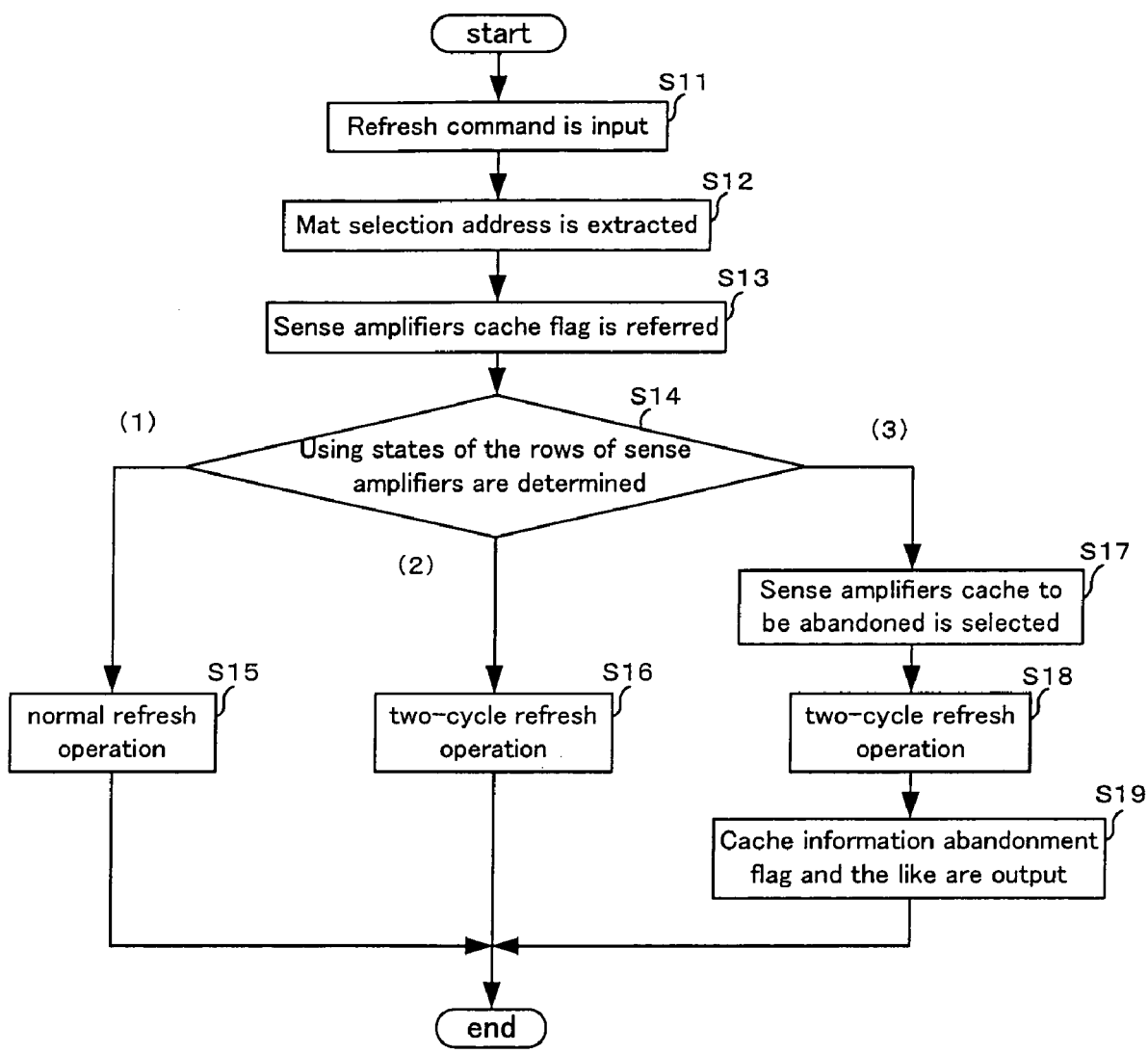
FIG. 17 is a schematic control flow of the refresh operation of the second example.

FIG. 17 is a schematic control flow of the refresh operation of the second example. As shown in FIG. 17, when a refresh command is input (step S11), a mat selection address is extracted by the array control circuit 62 from a refresh address generated by the refresh address counter 64 (step S12). This mat selection address enables determination of the mat 10 to be refreshed. Next, the sense amplifiers cache flag 65 is referred by the array control circuit 62 (step S13). Then, using states of the rows of sense amplifiers 11 on the right and left sides of the mat 10 each as a sense amplifiers cache are determined by comparing the state information of the sense amplifiers cache obtained in step S13 with the mat selection address of step S12 (step S14).

In step S14, the determination result is divided into three states and control is performed differently for each case. First, in a state in which neither of the rows of sense amplifiers 11 on the right and left sides of the mat 10 to be refreshed is used as a sense amplifiers cache, the normal refresh operation is performed (step S15). In a state in which only one of both rows of sense amplifiers 11 on the both sides of the mat 10 is used as a sense amplifiers cache, the two-cycle refresh operation described in the first example is performed (step S16) Operation and connection state in this case are the same as FIGS. 13 to 15.

The using state of the sense amplifiers cache can be changed when performing the refresh operation in step S16. That is, the row of sense amplifiers 11 which is not being used in step S16 can be used subsequently as a sense amplifiers cache. In an example of connecting state of FIG. 15, the refresh operation is performed with the bit lines BL1 and BL3 connected to the left side row of sense amplifiers 11a at the time of the refresh cycle of the second half. At this time, the row of sense amplifiers 11a which has been used for refreshing starts to be used as a sense amplifiers cache so that data of half of memory cells MC on the word line WL at this time is held.

Figure 18:
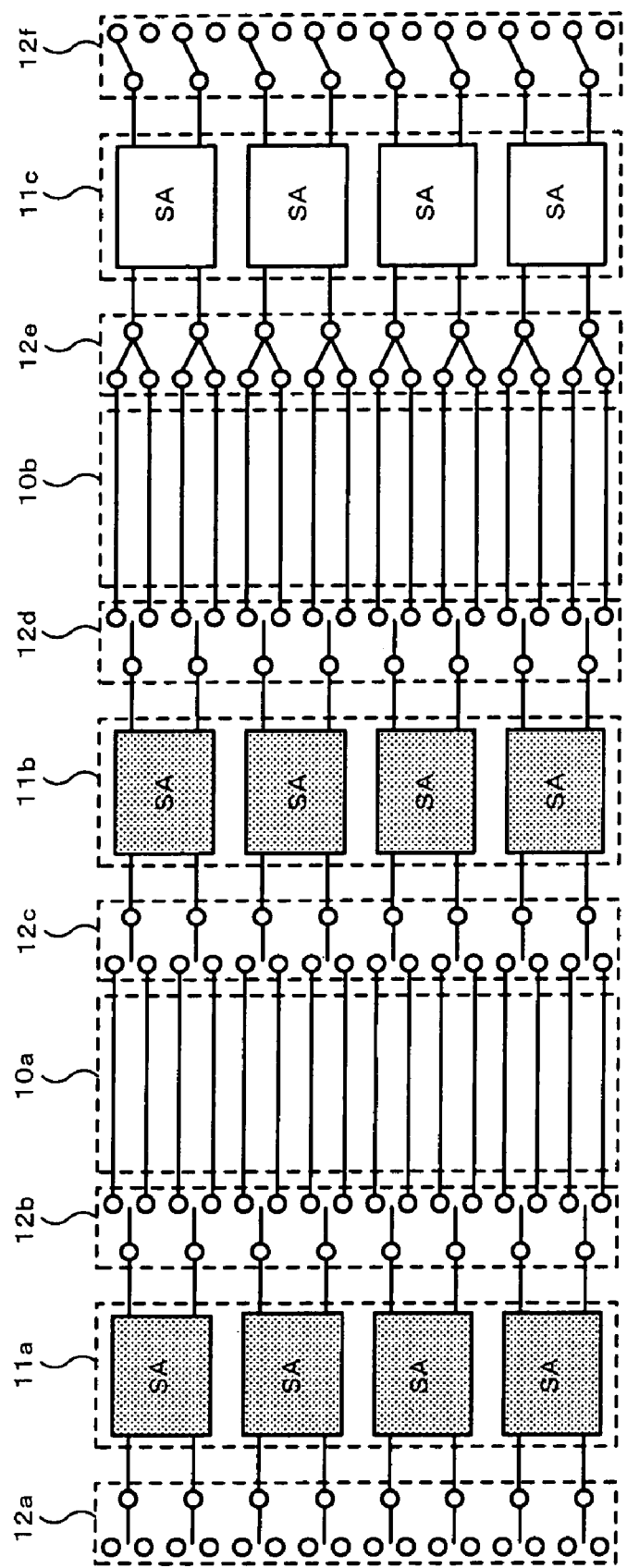
FIG. 18 is a connecting state diagram following the refresh cycle of the second half shown in FIG. 15.

FIG. 18 is a connecting state diagram following the refresh cycle of the second half shown in FIG. 15. In FIG. 18, switch controllers 12b and 12c on both sides of the mat 10a are controlled according to the state A of FIG. 5. Thus, all the bit lines BL of the mat 10a are disconnected from the rows of sense amplifiers 11a and 11b on the both sides so that both rows of sense amplifiers 11a and 11b on the right and left sides hold data as sense amplifiers caches.

In addition, if the rows of sense amplifiers 11a and 11b on the both sides of the mat 10a continue to hold data as shown in FIG. 18, it is necessary to provide the aforementioned pre-charge equalize circuit not on the side of the sense amplifier SA but between the switch controller 12b (or 12c) and each bit line BL. Consequently, even if the rows of sense amplifiers 11a and 11b are disconnected from the both sides of the mat 10a, the pre-charge operation for each bit line BL of the mat 10a to can be performed.

Next, in a state in which both rows of sense amplifiers 11 on the both sides of the mat 10 are used as the sense amplifiers cache in FIG. 17, one of both rows of sense amplifiers 11 is selected as a sense amplifiers cache which abandon holding data (step S17). Since the refresh operation cannot be performed if both rows of sense amplifiers 11a and 11b are used as the sense amplifiers caches as shown in FIG. 18, one of the sense amplifiers caches is controlled so as to abandon holding data. In this case, one row of sense amplifiers 11 may be selected in accordance with a predetermined rule in step S17.

The above-described two-cycle refresh operation is performed using the row of sense amplifiers 11 to be abandoned (step S18). Operation and a connecting state at this time are the same as FIGS. 13 to 15. After the refresh operation completes, the state information of the sense amplifiers cache flag 65 is updated and position information of the sense amplifiers cache to be abandoned and the cache information abandonment flag are output to outside (step S19).

In this manner, by fixing one row of sense amplifiers 11 (for example, left side) of the mat 10 as that abandon holding data of the sense amplifiers cache, at least the other row of sense amplifiers 11 can hold data for a long time regardless of the refresh operation. Further, the row of sense amplifiers 11 to be abandoned can be used as a sense amplifiers cache at least until next refresh operation is started.

In addition, the configuration of FIG. 16 and the control flow of FIG. 17 of the second example can be applied to the first example also except about the abandonment control of the sense amplifiers cache. In the first example, the using state of the sense amplifiers cache is determined in step S14 of FIG. 17 and the determination result is divided into two states in steps S15 and S16. In this case, the state information for determining whether or not each of a plurality of rows of sense amplifiers 11 is used as a sense amplifiers cache is stored in the sense amplifiers cache flag 65 in FIG. 16, but the cache information abandonment flag like the second example is not generated.

Figure 19:
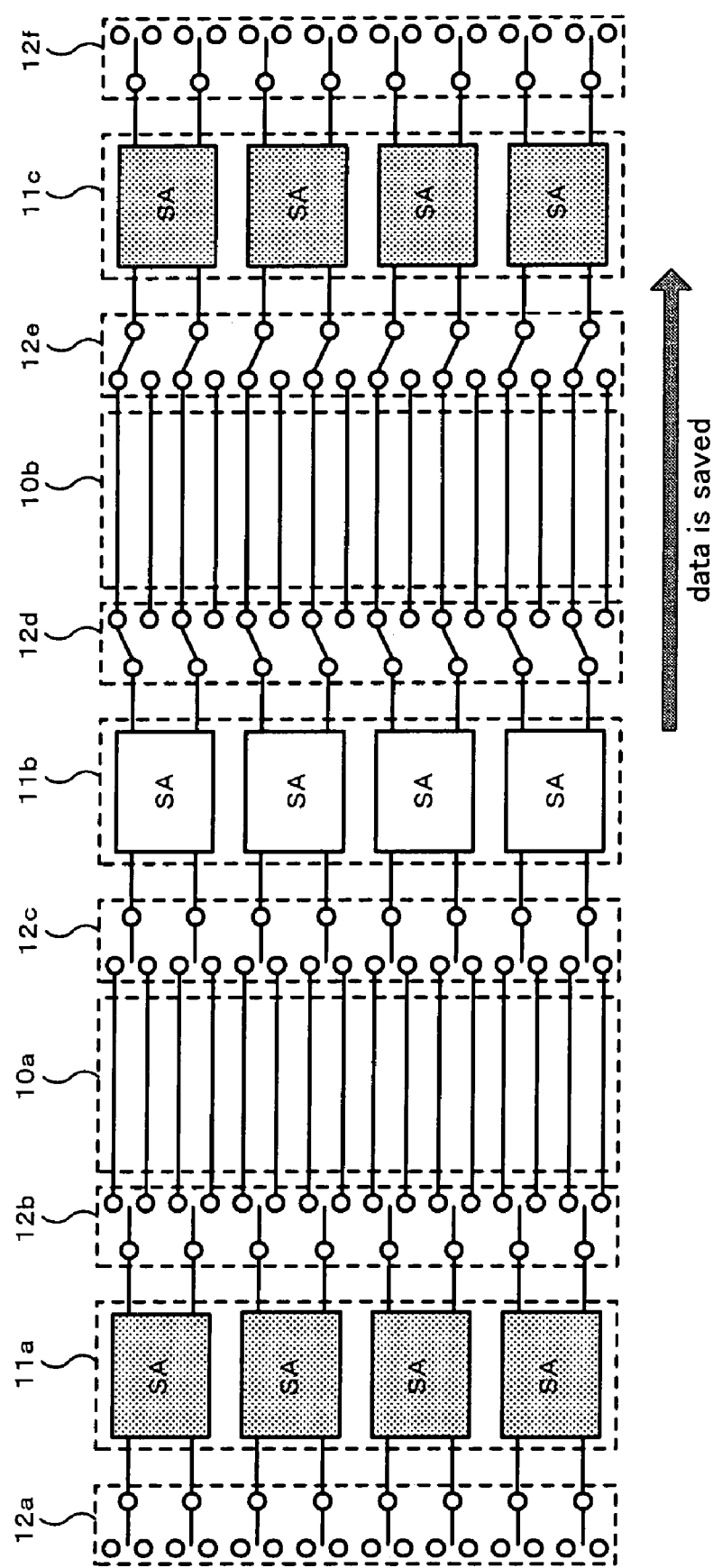
FIG. 19 is a connecting state diagram showing a state in which one of rows of sense amplifiers on both sides of the mat is saved in the second example.
Figure 20:
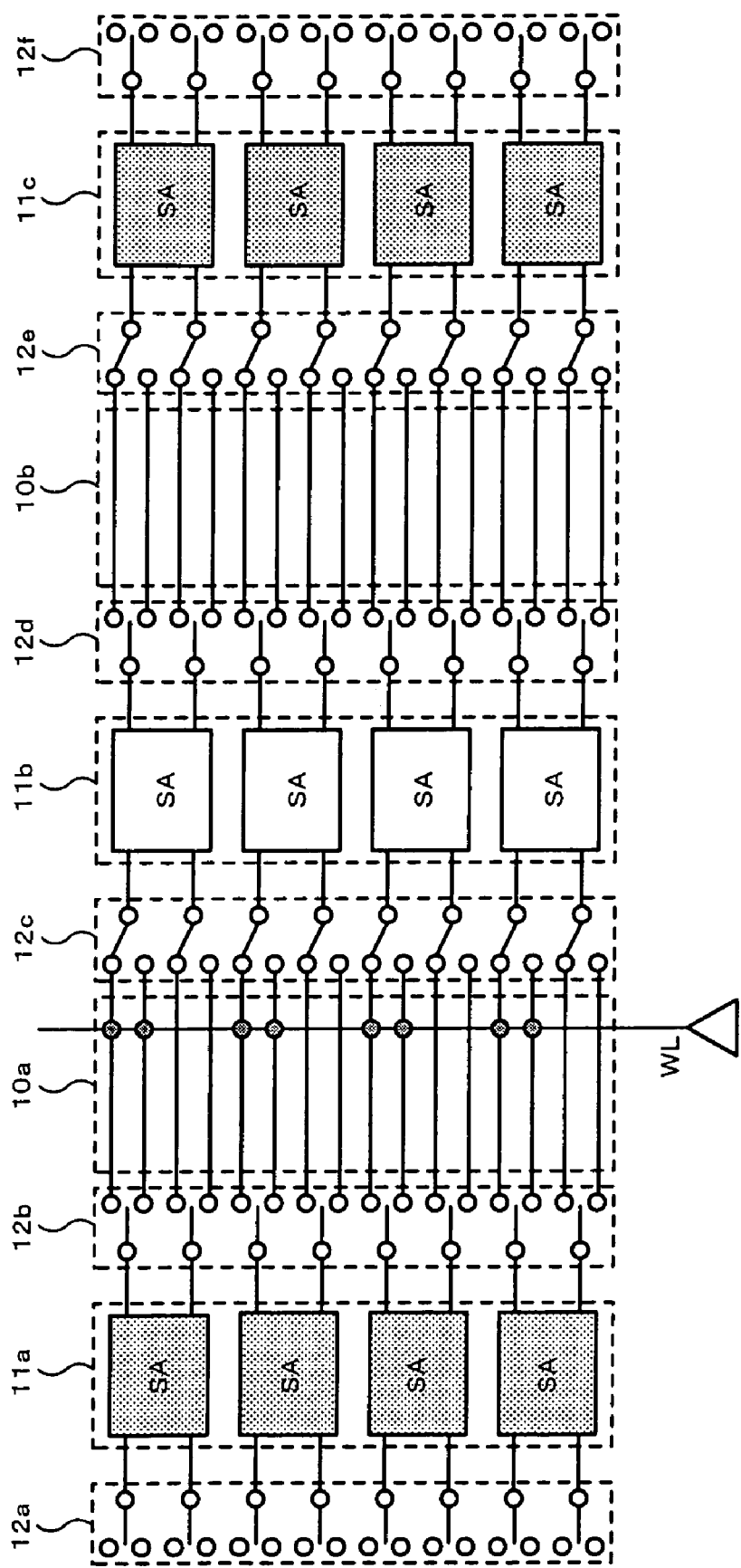
FIG. 20 is connecting state diagram of refresh cycle of first half in a modification of the second example.
Figure 21:
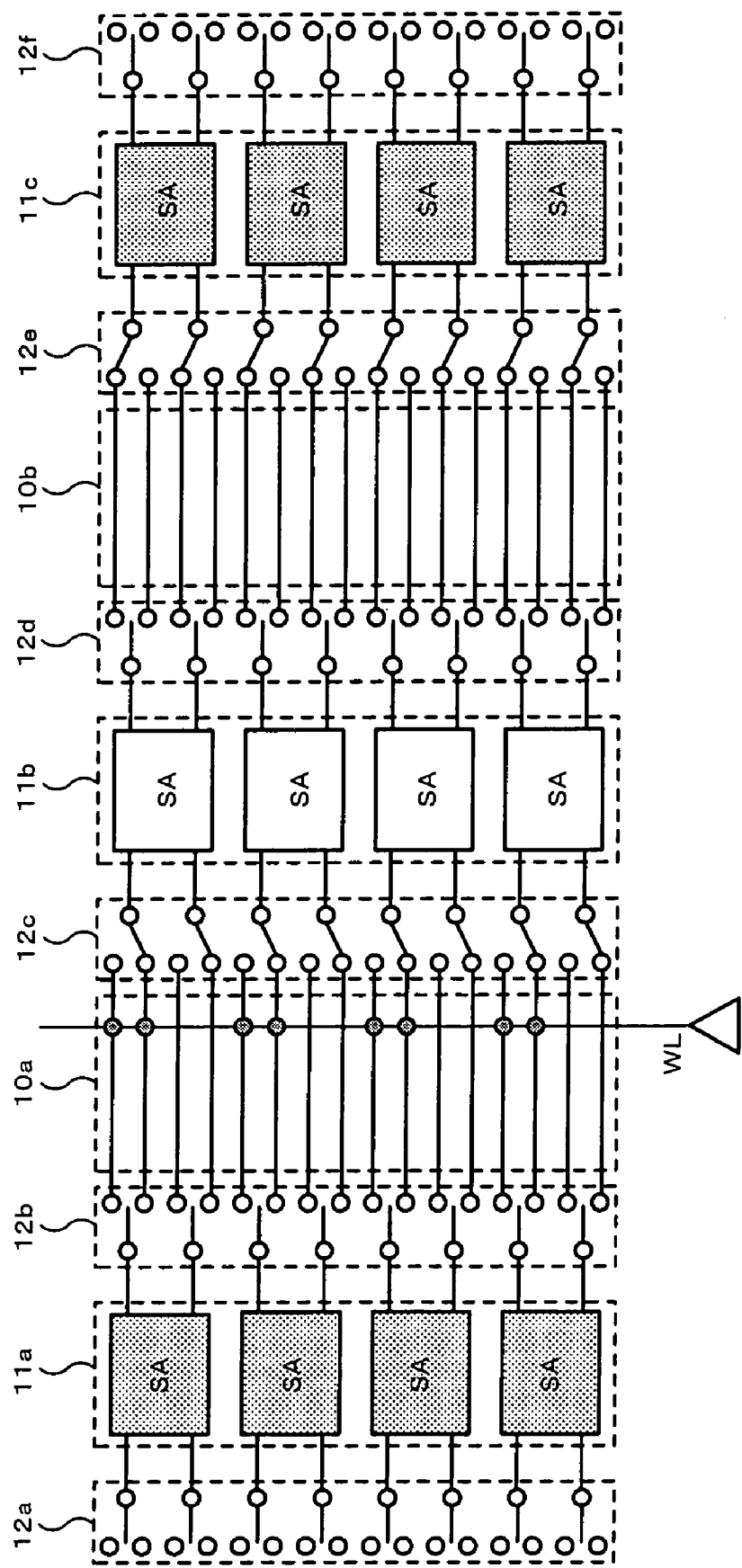
FIG. 21 is connecting state diagram of refresh cycle of second half in the modification of the second example.

The processing of steps S17 to S19 including the aforementioned abandonment control of the sense amplifiers has a modification to save data of the row of sense amplifiers 11 being used for the refresh operation. Operation of this modification will be described with reference to FIGS. 19 to 22. FIG. 19 is a connecting state diagram showing a state in which when receiving the refresh command, the rows of sense amplifiers 11a and 11b on both sides of the mat 10a are used as sense amplifiers caches and the right side row of sense amplifiers 11b of the mat 10a is to be used for the refresh operation. The switch controllers 12b and 12c on both sides of the mat 10a are controlled according to the state A of FIG. 5 and disconnected from the rows of sense amplifiers 11a and 11b on the both sides. On the contrary, the adjacent mat 10b is controlled to be connected to the rows of sense amplifiers 11b and 11c on both sides through the odd number bit lines BL based on the selection control lines SL1 and SL2 in order to save data of the right side row of sense amplifiers 11b.

In such a state, data in the row of sense amplifiers 11 is saved to the row of sense amplifiers 11c through the switch controller 12d, the odd number bit lines BL0 and BL2 of the mat 10b and the switch controller 12e in this order. Then, the refresh cycle of the first half of the two-cycle refresh operation is performed on the selected word line WL to be refreshed in the mat 10a with the connecting state shown in FIG. 20. Thereafter, the refresh cycle of the second half is executed with the connecting state shown in FIG. 21. Operation of this case is basically the same as FIGS. 14 and 15, except that the state of switch control in which data of the sense amplifier 11c for saving is protected from being destroyed.

Figure 22:
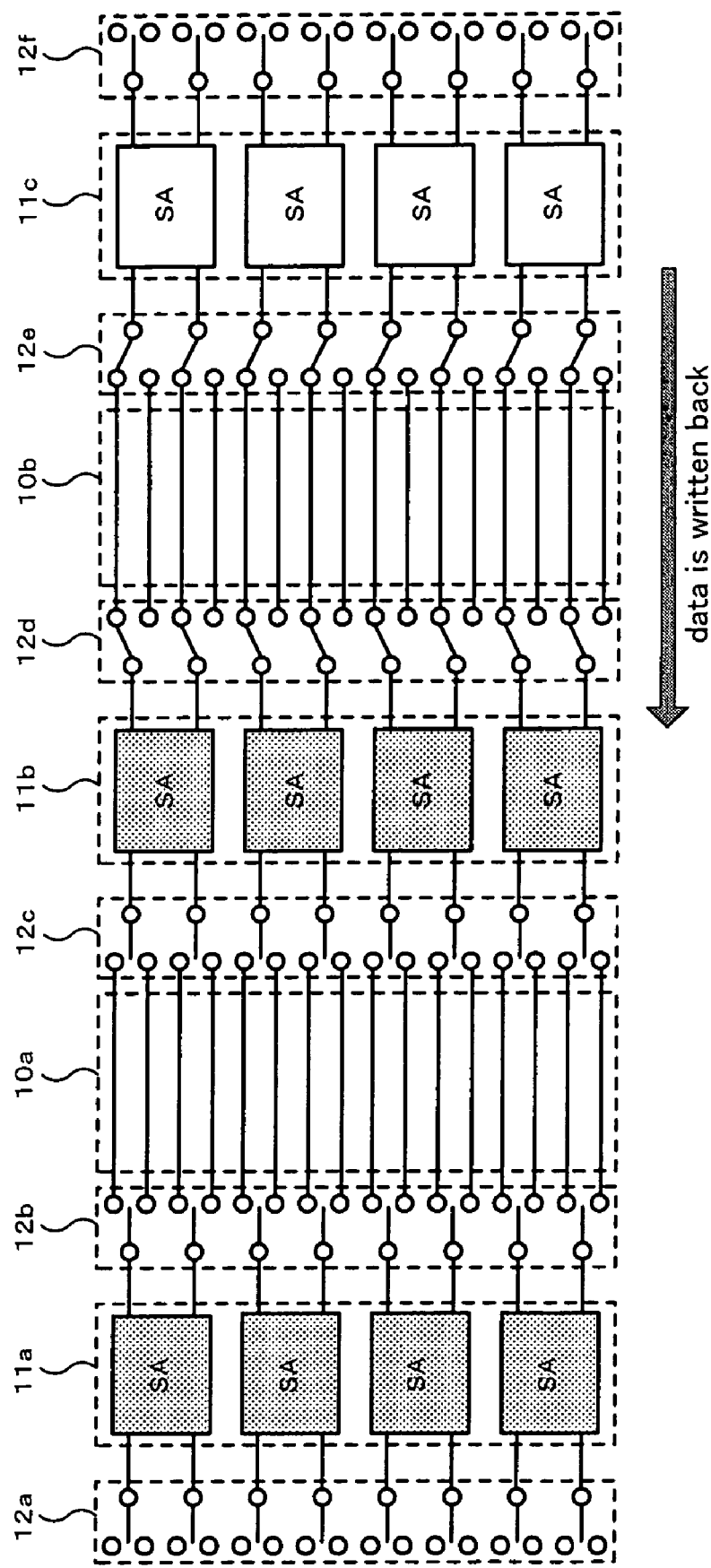
FIG. 22 is connecting state diagram in which saved data is written back to a original row of sense amplifiers following refresh cycle of second half.

When the two-cycle refresh operation is completed, the state is controlled to the same connecting state as FIG. 19 again as shown in FIG. 22, so that the saved data in the row of sense amplifiers 11c as the saving destination is written back to the original row of sense amplifiers 11b through the switch controller 12e, the odd number bit lines BL0 and BL2 of the mat 10b and the switch controller 12d. Consequently, both rows of sense amplifiers 11a and 11b of the mat 10a continues to be used as sense amplifiers caches and can hold data even if the refresh operation is performed. However, this modification can be applied only when the adjacent row of sense amplifiers 11 as the saving destination is not used as the sense amplifiers cache.

Next, the write-back operation of the sense amplifiers cache in data holding state will be described. In this embodiment, data stored into the sense amplifiers cache from the memory cells MC on a predetermined word line WL of the mat 10 matches with data held in memory cells MC on the predetermined word line WL at the beginning. However, the both data become unmatched due to write operation or the like after some time elapses. Thus, write-back operation of writing back data of the sense amplifiers cache to the original memory cells MC on the word line WL at a predetermined timing is needed.

Figure 23:
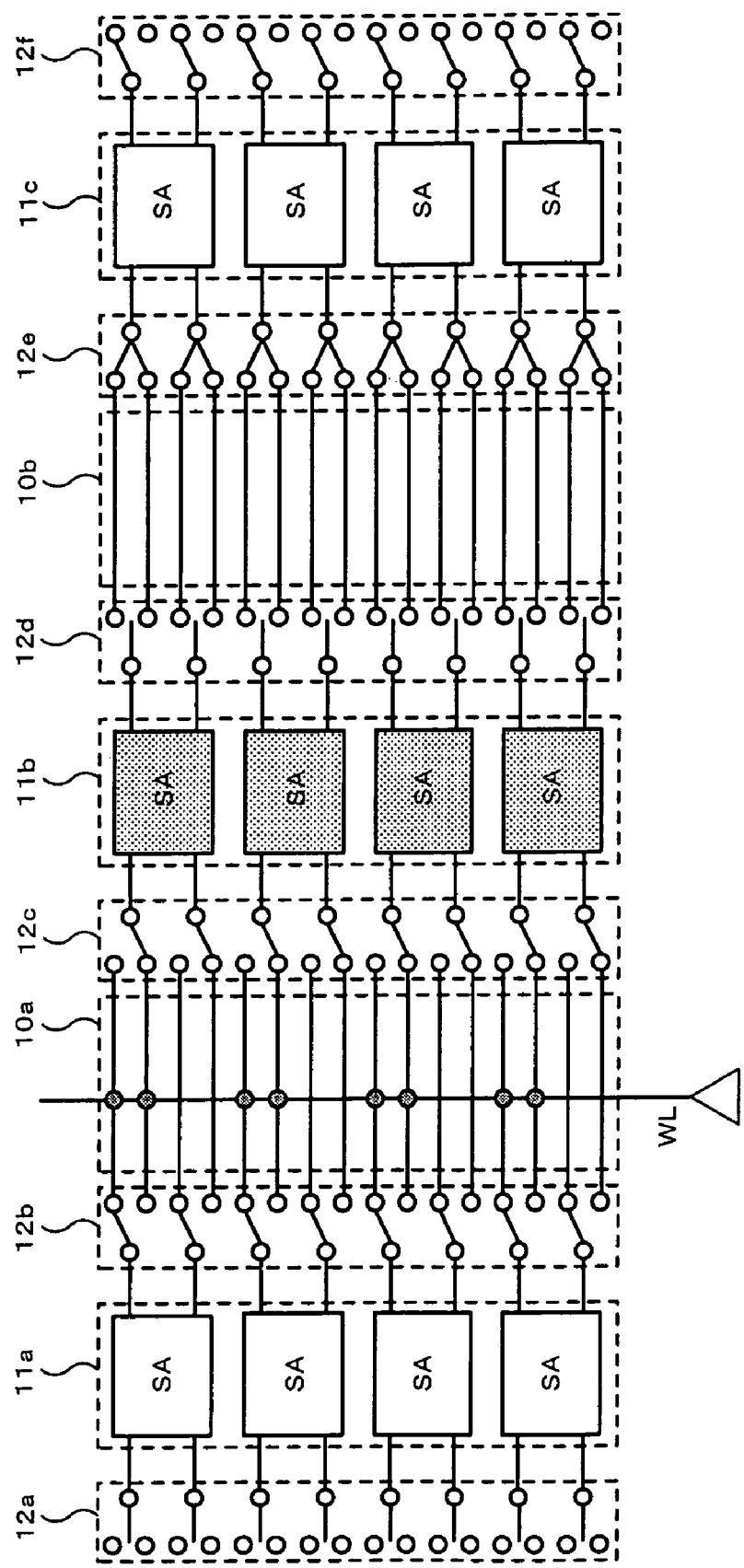
FIG. 23 is connecting state diagram in which write-back operation of the sense amplifiers cache in data holding state.

FIG. 23 is a connecting state diagram when performing the write-back operation. This write-back operation is performed at a timing of issuing the write-back command and the pre-charge operation to a target mat 10a is performed with the same connecting state of FIG. 14 prior to the write-back operation. Thereafter, as shown in FIG. 23, the switch controllers 12b and 12c on both sides of the mat 10a are controlled according to the state I of FIG. 5, the odd number bit lines BL0 and BL2 are connected to the left side row of sense amplifiers 11a, and the even number bit lines BL1 and BL3 are connected to the right side row of sense amplifiers 11b. A word line WL selected corresponding to the row address to be written back in the mat 10a is activated.

In such a state, data of the right side row of sense amplifiers 11b as a sense amplifiers cache in data holding state is written back to half of the memory cells on the selected word line WL through the switch controller 12c and the even number bit lines BL1 and BL3. At this time, a corresponding memory cells MC on the word line WL become matched with data held in the sense amplifiers cache. After the write-back operation, data can be stored into the sense amplifiers cache again by read-access to a desired word line WL even if data in the sense amplifiers cache is destroyed by the pre-charge operation or the like.

Figure 24:
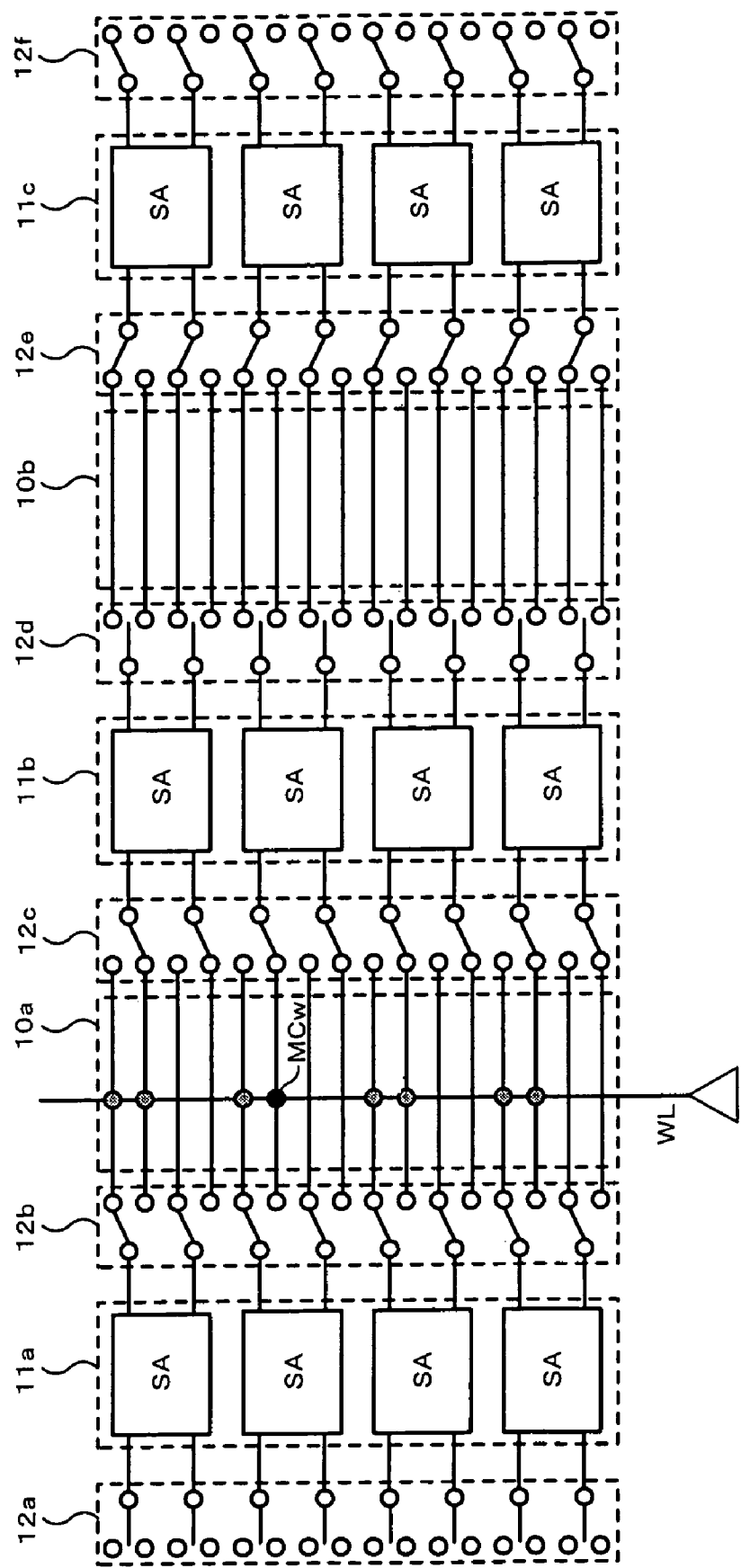
FIG. 24 is connecting state diagram in which refresh write-through operation of the sense amplifiers cache is performed.

Next, the write-through operation of the sense amplifiers cache in data holding state will be described. FIG. 24 is a connecting state diagram for performing the write-through operation. This write-through operation is performed at a timing of issuing the write-through command and further performed when data from outside is written directly to the memory cells MC of the mat 10 through the row of sense amplifiers 11. As shown in FIG. 24, the switch controllers 12b and 12c on both sides of the mat 10a are controlled to the same state as FIG. 23. At this time, a target memory cell MCw to be written is indicated on a selected word line WL. Predetermined data from outside is written to the target memory cell MCw on a single bit line BL through a sense amplifier SA in the right side row of sense amplifiers 11b and the switch controller 12c. The write-through operation shown in FIG. 24 is performed in the same manner as normal write operation.

Although the content of the present invention has been described specifically according to this embodiment, the present invention is not restricted to the above-described embodiment but may be modified in various ways within a scope not departing from the spirit of the invention. The various configurations such as the shared sense amplifier system, the ¼ pitch cell array configuration, the ½ pitch cell array configuration, the row of sense amplifiers 11 and the switch controllers 12 have been mentioned in the embodiment. However, the present invention is not restricted to these methods or configurations, and the present invention can be applied widely to a variety of the semiconductor storage devices including open bit line cell array configuration or the like.

The present invention is not limited to the above described embodiments, and various variations and modifications may be possible without departing from the scope of the present invention.

This application is based on the Japanese Patent application No. 2005-75088 filed on Mar. 16, 2005, entire content of which is expressly incorporated by reference herein.

What is claimed is:

1. A semiconductor storage device for rewritably storing data to each of unit blocks into which a memory cell array including a plurality of memory cells formed at intersections between a plurality of word lines and a plurality of bit lines is divided, comprising:

two rows of sense amplifiers arranged on one side and an other side of said plurality of bit lines in each said unit block and each including a plurality of sense amplifiers for amplifying data of said plurality of memory cells through said plurality of bit lines;

a switch means for switching a connecting state between one of said two rows of sense amplifiers and one side of said plurality of bit lines and switching a connecting state between an other of said two rows of sense amplifiers and an other side of said plurality of bit lines;

a control means which sets at least one of said two rows of sense amplifiers as a cache memory, and when performing refresh operation of said unit block in a state in which said row of sense amplifiers to be used as said cache memory holds data, controls said switch means so that said row of sense amplifiers to be used as said cache memory is disconnected from said plurality of bit lines and only said row of sense amplifiers not to be used as said cache memory is used in refresh operation.

2. A semiconductor storage device according to claim 1, wherein said memory cell array is configured using a shared sense amplifier system in which adjacent said unit blocks share each said row of sense amplifiers arranged therebetween.

3. A semiconductor storage device according to claim 1, wherein when performing refresh operation of said unit block in a state in which both said two rows of sense amplifiers holds data each as said cache memory, said control means selectively sets one of said rows of sense amplifiers to hold data and an other of said rows of sense amplifiers to abandon data, and controls said switch means so that said one of rows of sense amplifiers is disconnected from said plurality of bit lines and only said other of rows of sense amplifiers is used in refresh operation.

4. A semiconductor storage device according to claim 2, wherein when performing refresh operation of said unit block in a state in which both said two rows of sense amplifiers holds data each as said cache memory, said control means selectively sets one of said rows of sense amplifiers to hold data and an other of said rows of sense amplifiers to save data, and controls said switch means so that said one of rows of sense amplifiers is disconnected from said plurality of bit lines and data of said other of rows of sense amplifiers is saved to an adjacent said row of sense amplifiers through said plurality of bit lines on a unit block adjacent to said unit block, only said other of rows of sense amplifiers is used in refresh operation, and saved data in said adjacent row of sense amplifiers is written back to said other of rows of sense amplifiers through said plurality of bit lines.

5. A semiconductor storage device according to claim 3 or 4, wherein said control means holds state information for determining a using state of each said row of sense amplifiers as said cache memory and selectively sets said one of rows of sense amplifiers and said other of rows of sense amplifiers based on said sate information.

6. A semiconductor storage device according to claim 1 or 2, wherein in said refresh operation, after pre-charge operation for said plurality of bit lines using said row of sense amplifiers not to be used as said cache memory, two-cycle refresh operation in which said plurality of bit lines is divided into half for each cycle using said row of sense amplifiers is performed.

7. A semiconductor storage device according to claim 1, wherein each said sense amplifier included in said row of sense amplifiers has two input terminals for connecting a bit line pair composed of two bit lines, and said memory cell is formed at one of two intersections of said bit line pair on an arbitrary word line.

8. A semiconductor storage device according to claim 7, wherein said memory cell array has a ¼ pitch cell array configuration, and of four adjacent bit lines, said switch means switches a connection state of even number bit lines and a connection state of odd number bit lines respectively to said two input terminals of each said sense amplifier.

9. A semiconductor storage device according to claim 7, wherein said memory cell array has a ½ pitch cell array configuration, and of four adjacent bit lines, said switch means switches a connection state of a bit line pair composed of adjacent two bit lines on one side and a connection state of a bit line pair composed of adjacent two bit lines on an other side respectively to said two input terminals of each said sense amplifier.

10. A semiconductor storage device according to claim 8 or 9, wherein said switch means includes a first switch arranged between one of two bit line pair composed of said four bit line and each said sense amplifier, and a second switch arranged between an other bit line pair composed of said four bit line and each said sense amplifier.

11. A semiconductor storage device according to claim 10, wherein each of said first and second switches is a transistor switch controlled on/off by a selection control line connected to a gate thereof.

* * * * *